(12) United States Patent
Yata et al.

(10) Patent No.: US 9,666,645 B2
(45) Date of Patent: May 30, 2017

(54) DISPLAY DEVICE

(71) Applicant: Japan Display Inc., Tokyo (JP)

(72) Inventors: Tatsuya Yata, Tokyo (JP); Takayuki Nakanishi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/934,272

(22) Filed: Nov. 6, 2015

(65) Prior Publication Data

US 2016/0133675 A1 May 12, 2016

(30) Foreign Application Priority Data

Nov. 10, 2014 (JP) .................................. 2014-228369

(51) Int. Cl.
*H01L 29/20* (2006.01)
*H01L 27/32* (2006.01)
*H01L 51/52* (2006.01)

(52) U.S. Cl.
CPC ...... *H01L 27/3218* (2013.01); *H01L 27/3213* (2013.01); *H01L 27/3216* (2013.01); *H01L 27/322* (2013.01); *H01L 51/5284* (2013.01)

(58) Field of Classification Search
CPC ............. H01L 27/3218; H01L 27/3213; H01L 27/3216

USPC .......................................................... 257/89
See application file for complete search history.

(56) References Cited

U.S. PATENT DOCUMENTS

2014/0117339 A1* 5/2014 Seo ....................... H01L 51/504
257/40

FOREIGN PATENT DOCUMENTS

JP 2002-289343 A 10/2002
JP 2010-250259 A 11/2010

* cited by examiner

*Primary Examiner* — Anthony Ho
(74) *Attorney, Agent, or Firm* — Typha IP LLC

(57) ABSTRACT

A display device includes: a substrate; a first light emitting layer extending in a first direction along a column or a row of a plurality of sub-pixels arranged in a matrix on the substrate; a second light emitting layer that extends in the first direction, is arranged alternately with the first light emitting layer in a second direction, and emits light of a wavelength different from that of the first light emitting layer; and a color conversion layer that is arranged at a position for covering at least part of the first light emitting layer, absorbs light emitted from the first light emitting layer, and converts the absorbed light so that a wavelength of the absorbed light becomes longer.

7 Claims, 19 Drawing Sheets

DISPLAY DEVICE

CROSS-REFERENCE TO RELATED APPLICATION(S)

This application claims priority from Japanese Application No. 2014-228369, filed on Nov. 10, 2014, the contents of which are incorporated by reference herein in its entirety.

BACKGROUND

1. Technical Field

The present disclosure relates to a display device.

2. Description of the Related Art

In the related art, known are display devices that light a self-luminous body such as an organic light emitting diode (OLED) in addition to liquid crystal display devices. For example, Japanese Patent Application Laid-open Publication No. 2002-289343 discloses a method of manufacturing an organic electric field light emitting element in which a first electrode, a thin film layer made of at least an organic compound and including layers that emit light in different colors, and a second electrode are sequentially laminated on a substrate, and light emitting layers are made in different vacuum chambers for each light emitting color.

This display device is made with different light emitting layers for each light emitting color, so that when the number of pixels in the entire panel is increased, an area for each sub-pixel is decreased and light emission quantity may be lowered.

SUMMARY

According to an aspect, a display device includes: a substrate; a first light emitting layer extending in a first direction along a column or a row of a plurality of sub-pixels arranged in a matrix on the substrate; a second light emitting layer that extends in the first direction, is arranged alternately with the first light emitting layer in a second direction, and emits light of a wavelength different from that of the first light emitting layer; and a color conversion layer that is arranged at a position for covering at least part of the first light emitting layer, absorbs light emitted from the first light emitting layer, and converts the absorbed light so that a wavelength of the absorbed light becomes longer.

DETAILED DESCRIPTION

Figure 1:
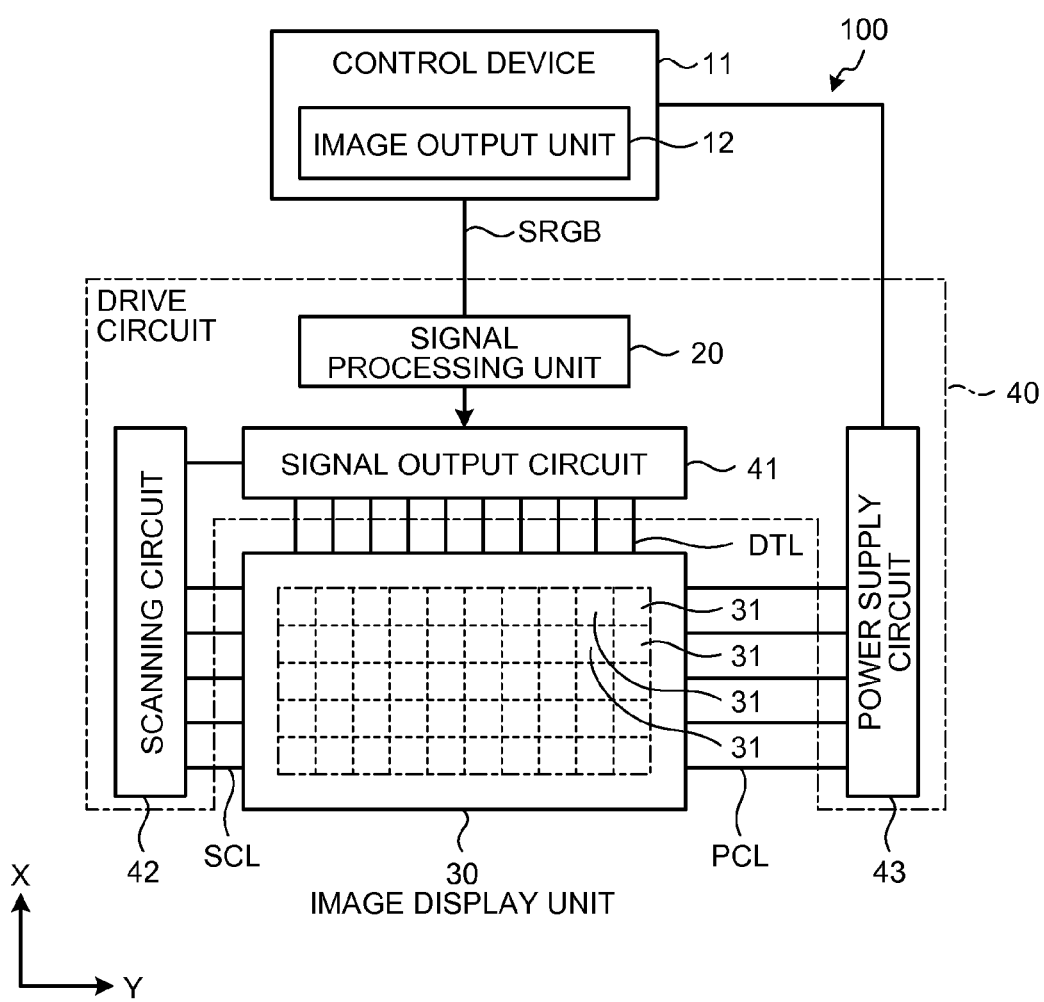
FIG. 1 is a block diagram illustrating a configuration example of a display device according to an embodiment.

The following describes embodiments of the present invention in detail with reference to the drawings. The present invention is not limited to the embodiments described below. Components described below include a component that is easily conceivable by those skilled in the art and substantially the same component. The components described below can be appropriately combined. The disclosure is merely an example, and the present invention naturally encompasses appropriate modifications maintaining the gist of the invention that is easily conceivable by those skilled in the art. To further clarify the description, a width, a thickness, a shape, and the like of each component may be schematically illustrated in the drawings as compared with an actual aspect. However, this is merely an example and interpretation of the invention is not limited thereto. The same elements as those described in the drawings that have already been discussed are denoted by the same reference numerals throughout the description and the drawings, and detailed description thereof will not be repeated in some cases.

FIG. 1 is a block diagram illustrating a configuration example of a display device according to an embodiment. As illustrated in FIG. 1, a display device 100 includes a signal processing unit 20 that processes an input image signal (hereinafter also referred to as an "input signal") input from an image output unit 12 of a control device 11, an image display unit 30 serving as an image display panel, and a drive circuit 40 that controls driving of the image display unit 30. A function of the signal processing unit 20 may be implemented as hardware or software, and is not specifically limited. Even when respective circuits of the signal processing unit 20 are configured as hardware, the circuits are not necessarily physically separated from each other. A plurality of functions may be implemented with a physically single circuit.

The signal processing unit 20 generates an output signal by converting the input image signal as first color information based on an input value of a hue-saturation-value (HSV) color space to be displayed on a predetermined pixel obtained based on the input signal into an extended value of the HSV color space that is extended by being displayed by each sub-pixel included in a pixel 31 described below.

As described in a first embodiment described below, the signal processing unit 20 may directly use a red (R) component that is a first color component, a green (G) component that is a second color component, and a blue (B) component that is a third color component as they are without being converted, based on the first color information in the input image signal in some cases. The signal processing unit 20 is not necessarily required if the drive circuit 40 can directly process the input signal input from the image output unit 12. The signal processing unit 20 may be provided in the control device 11.

The drive circuit 40 is a control device for the image display unit 30, and includes a signal output circuit 41, a scanning circuit 42, and a power supply circuit 43. The drive circuit 40 uses the signal output circuit 41 to hold and sequentially output an output signal including second color information to each pixel 31 of the image display unit 30. The signal output circuit 41 is electrically coupled to the image display unit 30 via a signal line DTL. The drive circuit 40 uses the scanning circuit 42 to select a sub-pixel in the image display unit 30, and control a switching element to be turned ON and OFF (for example, a thin film transistor (TFT)) for controlling an operation (light transmittance) of the sub-pixel. The scanning circuit 42 is electrically coupled to the image display unit 30 via a scanning line SCL. The power supply circuit 43 is controlled by the control device 11, and supplies electric power to a self-luminous body (described below) of each pixel 31 via a power supply line PCL.

As illustrated in FIG. 1, in the image display unit 30, $P_0 \times Q_0$ pixels 31 ($P_0$ in a row direction, and $Q_0$ in a column direction) are arranged in a two-dimensional matrix (rows and columns). For example, in the image display unit 30, the column extends in the X-direction (first direction), and the row extends in the Y-direction (second direction).

Figure 2:
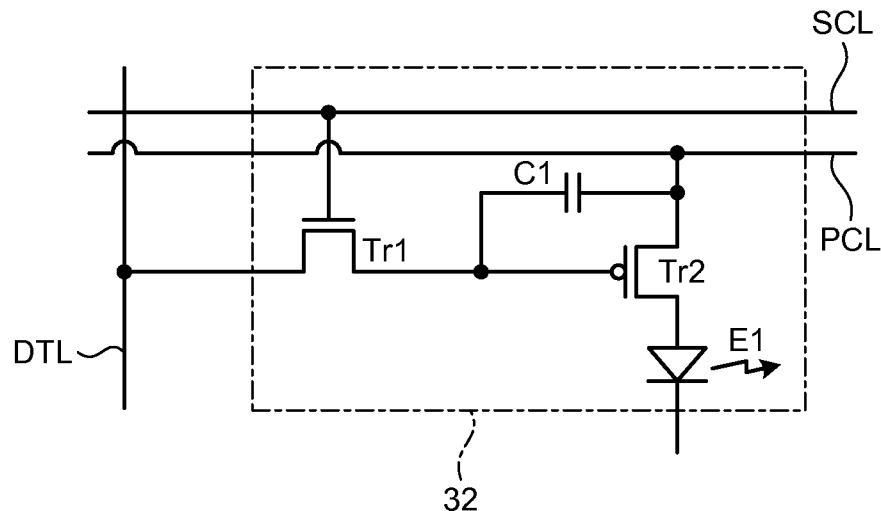
FIG. 2 is a diagram illustrating a lighting drive circuit of a sub-pixel included in a pixel of an image display unit according to an embodiment.

FIG. 2 is a diagram illustrating a lighting drive circuit of a sub-pixel included in a pixel of the image display unit according to the embodiment. The pixel 31 includes a plurality of sub-pixels 32. Lighting drive circuits of the sub-pixels 32 illustrated in FIG. 2 are arrayed in a two-dimensional matrix (rows and columns). The lighting drive circuit includes a control transistor Tr1, a driving transistor Tr2, and a charge holding capacitor C1. A gate of the control transistor Tr1 is coupled to the scanning line SCL, a source thereof is coupled to the signal line DTL, and a drain thereof is coupled to a gate of the driving transistor Tr2. One end of the charge holding capacitor C1 is coupled to the gate of the driving transistor Tr2, and the other end thereof is coupled to a source of the driving transistor Tr2. The source of the driving transistor Tr2 is coupled to the power supply line PCL, and a drain of the driving transistor Tr2 is coupled to an anode of an organic light emitting diode E1 serving as the self-luminous body. A cathode of the organic light emitting diode E1 is coupled to, for example, a reference potential (for example, the ground).

In the example of FIG. 2, the control transistor Tr1 is an n-channel transistor, and the driving transistor Tr2 is a p-channel transistor. However, polarities of the transistors are not limited thereto. The polarity of each of the control transistor Tr1 and the driving transistor Tr2 may be determined as needed.

First Embodiment

Figure 3:
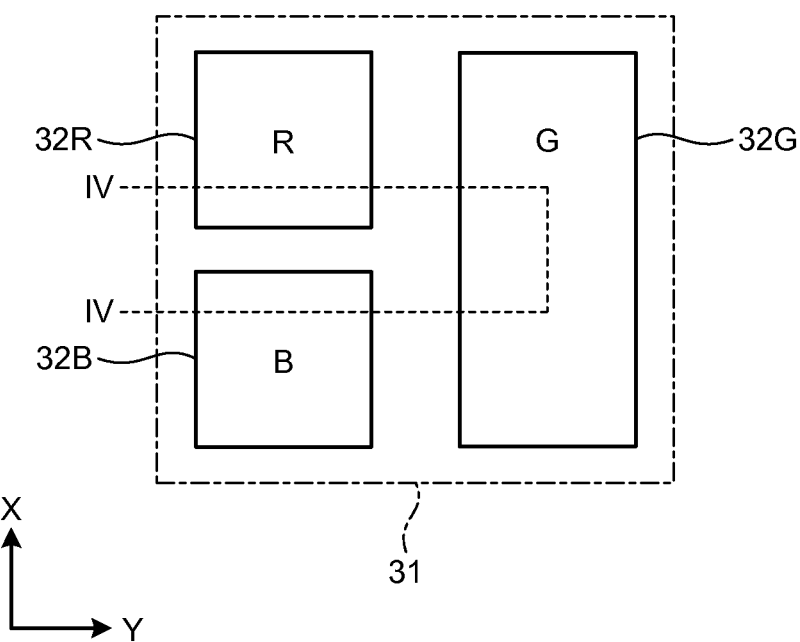
FIG. 3 is a diagram illustrating an array of sub-pixels in an image display unit according to a first embodiment.
Figure 4:
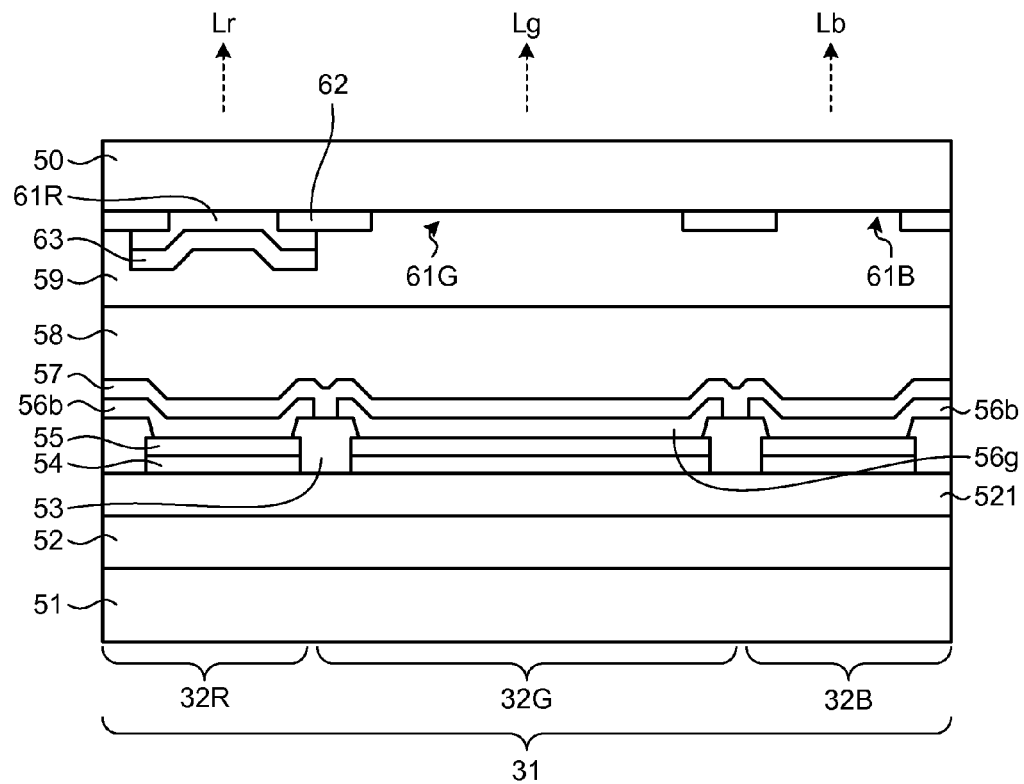
FIG. 4 is a diagram illustrating a cross-sectional structure of the image display unit according to the first embodiment.
Figure 5:
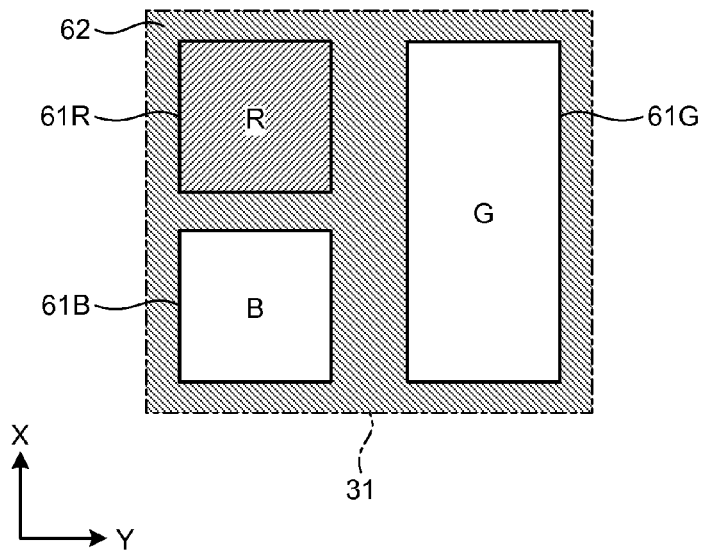
FIG. 5 is a diagram illustrating an array of filters or openings of a counter substrate according to the first embodiment.

With reference to FIG. 1 and FIG. 2 described above, the following describes a display device according to the first embodiment using FIG. 3 to FIG. 9. FIG. 3 is a diagram illustrating an array of sub-pixels in the image display unit according to the first embodiment. FIG. 4 is a diagram illustrating a cross-sectional structure of the image display unit according to the first embodiment. FIG. 4 illustrates a cross-sectional structure representing a IV-IV cross section in FIG. 3. FIG. 5 is a diagram illustrating an array of color filters or openings of a counter substrate according to the first embodiment.

As illustrated in FIG. 3, for example, the pixel 31 includes a first sub-pixel 32R, a second sub-pixel 32G, and a third sub-pixel 32B. The first sub-pixel 32R emits light of a first color (for example, the red (R) component). The second sub-pixel 32G emits light of a second color (for example, the green (G) component). The third sub-pixel 32B emits light of a third color (for example, the blue (B) component). In the following description, when it is not necessary to distinguish the first sub-pixel 32R, the second sub-pixel 32G, and the third sub-pixel 32B from one another, they are collectively referred to as the sub-pixels 32.

The image display unit 30 includes a substrate 51, insulating layers 52 and 53, a reflective layer 54, a lower electrode 55, a first light emitting layer 56b, a second light emitting layer 56g, an upper electrode 57, an insulating layer 58, an insulating layer 59, a color filter 61R serving as a filter layer, a black matrix 62 serving as a light shielding layer, a color conversion layer 63, and a substrate 50 (refer to FIG. 4). Examples of the substrate 51 include a semiconductor substrate made of silicon and the like, a glass substrate, and a resin substrate. The substrate 51 forms or holds the lighting drive circuit and the like described above. The insulating layer 52 is a protective film that protects the lighting drive circuit and the like described above, and may be made of silicon oxide, silicon nitride, and the like. Above the insulating layer 52, provided is a circuit layer 521 including the lighting drive circuits formed thereon such as the control transistor Tr1, the driving transistor Tr2, and the charge holding capacitor C1 described above. However, details thereof are not illustrated in FIG. 4. The lower electrode 55 is provided to each of the first sub-pixel 32R, the second sub-pixel 32G, and the third sub-pixel 32B, and is an electric conductor serving as the anode (positive pole) of the organic light emitting diode E1 described above. The lower electrode 55 is a translucent electrode made of a translucent conductive material (translucent conductive oxide) such as indium tin oxide (ITO). The insulating layer 53 is called a bank, and partitions the first sub-pixel 32R, the second sub-pixel 32G, and the third sub-pixel 32B. The reflective layer 54 is made of a material having metallic luster that reflects light from the first light emitting layer 56b and the second light emitting layer 56g, such as silver, aluminum, and gold. The first light emitting layer 56b and the second light emitting layer 56g include an organic material that can emit light when a voltage is applied thereto, and are self-luminous layers including a hole injection layer, a hole transport layer, a light emitting layer, an electron transport layer, and an electron injection layer, which are not illustrated. In embodiments of the present invention, the light emitting layer means a layer including a light emitting region. Naturally, light is not emitted in a region in which electric charges are not recoupled even in the light emitting layer.

Hole Transport Layer

As a layer that generates a positive hole, for example, preferably used is a layer including an aromatic amine compound and a substance that exhibits an electron accepting property with respect to the compound. In this case, the aromatic amine compound is a substance having an arylamine skeleton. Among the aromatic amine compounds, especially preferred is a compound that contains triphenylamine in the skeleton thereof and has a molecular weight of 400 or more. Among the aromatic amine compounds containing triphenylamine in the skeleton thereof, especially preferred is a compound containing a condensed aromatic ring such as a naphthyl group in the skeleton thereof. Heat resistance of a light-emitting element is improved by using the aromatic amine compound containing triphenylamine and a condensed aromatic ring in the skeleton thereof. Specific examples of the aromatic amine compound include 4,4'-bis[N-(1-naphthyl)-N-phenylamino]biphenyl (abbreviated as α-NPD), 4,4'-bis[N-(3-methylphenyl)-N-phenylamino]biphenyl (abbreviated as TPD), 4,4',4"-tris(N,N-diphenylamino)triphenylamine (abbreviated as TDATA), 4,4',4"-tris[N-(3-methylphenyl)-N-phenylamino]triphenylamine (abbreviated as MTDATA), 4,4'-bis[N-{4-(N,N-di-m-tolylamino)phenyl}-N-phenylamino]biphenyl (abbreviated as DNTPD), 1,3,5-tris[N,N-di(m-tolyl)amino]benzene (abbreviated as m-MTDAB), 4,4',4"-tris(N-carbazolyl)triphenylamine (abbreviated as TCTA), 2,3-bis(4-diphenylaminophenyl)quinoxaline (abbreviated as TPAQn), 2,2',3,3'-tetrakis(4-diphenylaminophenyl)-6,6'-bisquinoxaline (abbreviated as D-TriPhAQn), and 2,3-bis{4-[N-(1-naphthyl)-N-phenylamino]phenyl}-dibenzo[f,h]quinoxaline (abbreviated as NPADiBzQn). The substance that exhibits the electron accepting property with respect to the aromatic amine compound is not specifically limited. Examples of the substance include molybdenum oxides, vanadium oxides, 7,7,8,8-tetracyanoquinodimethane (abbreviated as TCNQ), and 2,3,5,6-tetrafluoro-7,7,8,8-tetracyano-quinodimethane (abbreviated as F4-TCNQ).

Electron Injection Layer, Electron Transport Layer

An electron transport substance is not specifically limited. Examples of the electron transport substance include a metal complex such as tris(8-quinolinolato)aluminum (abbreviated as Alq3), tris(4-methyl-8-quinolinolato)aluminum (abbreviated as Almq3), bis(10-hydroxybenzo[h]-quinolinato) beryllium (abbreviated as BeBq2), bis(2-methyl-8-quinolinolato)-4-phenylphenolato-aluminum (abbreviated as BAlq), bis[2-(2-hydroxyphenyl)benzoxazolato]zinc (abbreviated as Zn(BOX)2), and bis[2-(2-hydroxyphenyl)benzothiazolato]zinc (abbreviated as Zn(BTZ)2). Examples thereof also include 2-(4-biphenylyl)-5-(4-tert-butylphenyl)-1,3,4-oxadiazole (abbreviated as PBD), 1,3-bis[5-(p-tert-butylphenyl)-1,3,4-oxadiazol-2-yl]benzene (abbreviated as OXD-7), 3-(4-tert-butylphenyl)-4-phenyl-5-(4-biphenylyl)-1,2,4-triazole (abbreviated as TAZ), 3-(4-tert-butylphenyl)-4-(4-ethylphenyl)-5-(4-biphenylyl)-1,2,4-triazole (abbreviated as p-EtTAZ), bathophenanthroline (abbreviated as BPhen), and bathocuproine (abbreviated as BCP). A substance that exhibits an electron donating property with respect to the electron transport substance is not specifically limited. Examples of the substance include an alkali metal such as lithium and cesium, an alkaline-earth metal such as magnesium and calcium, and a rare earth metal such as erbium and ytterbium. A substance selected from an alkali metal oxide and an alkaline-earth metal oxide such as lithium oxide ($Li_2O$), calcium oxide (CaO), sodium oxide ($Na_2O$), potassium oxide ($K_2O$), and magnesium oxide (MgO) may be used as the substance that exhibits the electron donating property with respect to the electron transport substance.

Light Emitting Layer

To obtain green-based light emission, a substance exhibiting light emission that has a peak of emission spectrum in a range from 500 nm to 550 nm may be used for the second light emitting layer 56g described above. Examples of the substance exhibiting the green-based light emission include N,N'-dimethylquinacridone (abbreviated as DMQd), coumarin 6, coumarin 545T, and tris(8-quinolinolato)aluminum (abbreviated as $Alq_3$).

To obtain blue-based light emission, a substance exhibiting light emission that has a peak of emission spectrum in a range from 420 nm to 500 nm may be used for the first light emitting layer 56b described above.

Examples of the substance exhibiting the blue-based light emission include 9,10-bis(2-naphthyl)-tert-butylanthracene (abbreviated as t-BuDNA), 9,9'-bianthryl, 9,10-diphenylanthracene (abbreviated as DPA), 9,10-bis(2-naphthyl)anthracene (abbreviated as DNA), bis(2-methyl-8-quinolinolato)-4-phenylphenolato-gallium (abbreviated as BGaq), and bis (2-methyl-8-quinolinolato)-4-phenylphenolato-aluminum (abbreviated as BAlq).

In addition to the substance that emits fluorescence as described above, a substance that emits phosphorescence can also be used as a light-emitting substance. Examples of the substance that emits phosphorescence include bis[2-(3,5-bis(trifluoromethyl)phenyl)pyridinato-N,C2']iridium(III) picolinate (abbreviated as Ir(CF3ppy)2(pic)), bis[2-(4,6-difluorophenyl)pyridinato-N,C2']iridium(III)acetylacetonate (abbreviated as FIr(acac)), bis[2-(4,6-difluorophenyl)pyridinato-N,C2']iridium(III)picolinate (FIr(pic)), and tris(2-phenylpyridinato-N,C2')iridium (abbreviated as Ir(ppy)3).

The upper electrode 57 is a translucent electrode made of a translucent conductive material (translucent conductive oxide) such as indium tin oxide (ITO). In the embodiment, ITO is exemplified as the translucent conductive material, but the translucent conductive material is not limited thereto. As the translucent conductive material, a conductive material having another composition such as indium zinc oxide (IZO) may be used. The upper electrode 57 serves as the cathode (negative pole) of the organic light-emitting diode E1. The insulating layer 58 is a sealing layer that seals the upper electrode 57 described above. As the insulating layer 58, silicon oxide, silicon nitride, and the like may be used. The insulating layer 59 is a planarization layer that prevents a level difference from being generated due to the bank. As the insulating layer 59, silicon oxide, silicon nitride, and the like may be used. The substrate 50 is a translucent substrate that protects the entire image display unit 30. For example, a glass substrate may be used as the substrate 50.

In the example of FIG. 4, the lower electrode 55 serves as the anode (positive pole) and the upper electrode 57 serves as the cathode (negative pole). However, the embodiment is not limited thereto. The lower electrode 55 may serve as the cathode and the upper electrode 57 may serve as the anode. In this case, the polarity of the driving transistor Tr2 electrically coupled to the lower electrode 55 can be appropriately changed, and a stacking order of a carrier injection layer (the hole injection layer and the electron injection layer), a carrier transport layer (the hole transport layer and the electron transport layer), and the light emitting layer can also be appropriately changed.

The image display unit 30 is a color display panel and, as illustrated in FIG. 4, includes the color conversion layer 63 and the color filter 61R for transmitting first color light Lr among light emitting components of the first light emitting layer 56b, which are arranged between the first light emitting layer 56b and an image observer.

The image display unit 30 also includes an opening 61G through which the light emitting component of the second light emitting layer 56g can be emitted to the image observer. Similarly, the image display unit 30 includes an opening 61B through which the light emitting component of the first light emitting layer 56b can be emitted to the image observer. The opening 61G and the opening 61B may include a transparent resin layer or a color filter that transmits a color corresponding to each of the openings. In this way, the opening 61G and the opening 61B can prevent a large level difference from being generated in the insulating layer 59 by providing the transparent resin layer and the like.

The color filter 61R, the opening 61G, and the opening 61B illustrated in FIG. 5 are not shielded from the light by the black matrix 62. The first color light Lr, the second color light Lg, and the third color light Lb illustrated in FIG. 4 pass through the color filter 61R, the opening 61G, and the opening 61B and are emitted from the substrate 50 to the observer.

Figure 6:
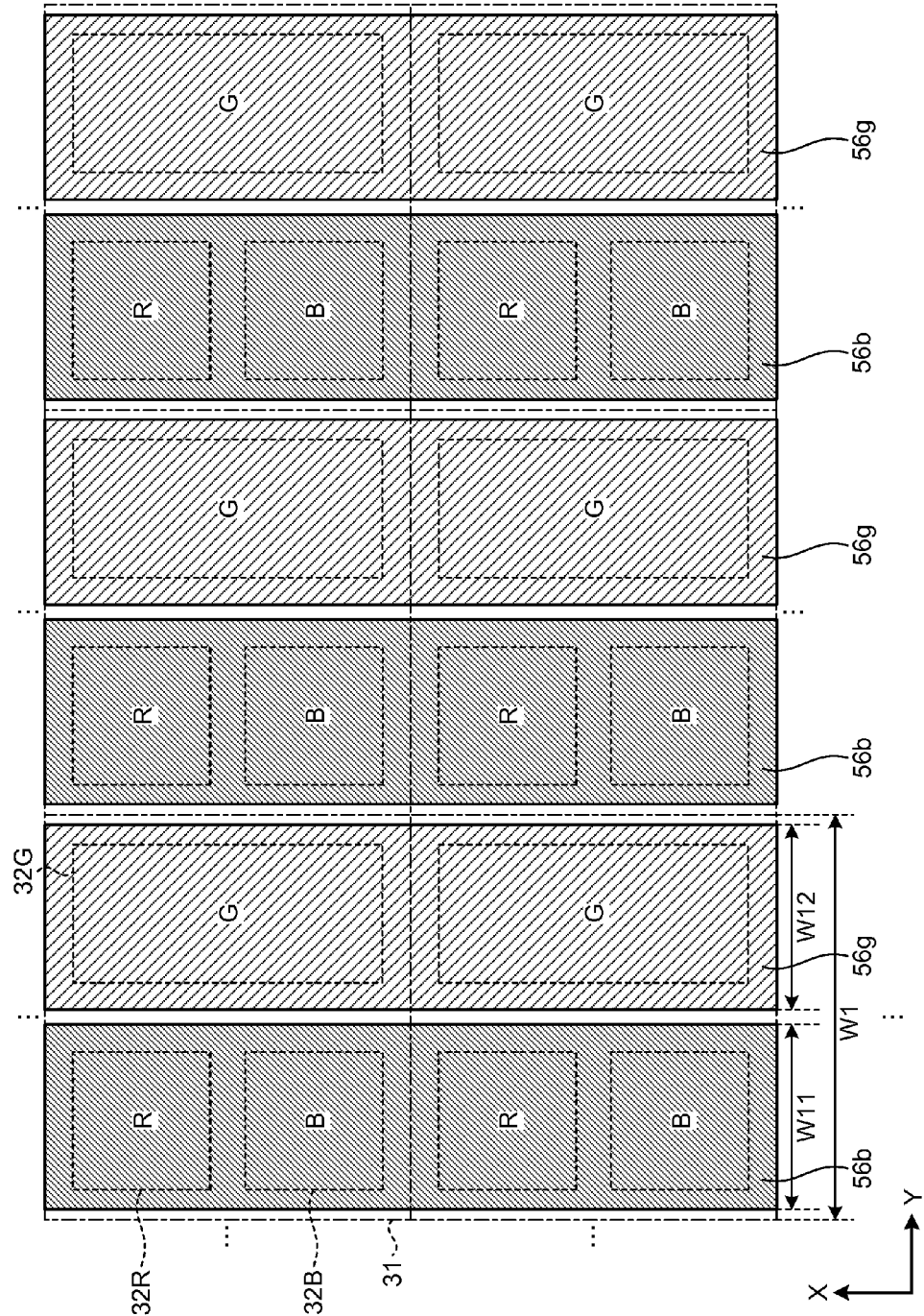
FIG. 6 is a schematic diagram illustrating a planar arrangement of a first light emitting layer and a second light emitting layer according to the first embodiment.

FIG. 6 is a schematic diagram illustrating a planar arrangement of the first light emitting layer and the second light emitting layer according to the first embodiment. The first light emitting layer 56b and the second light emitting layer 56g according to the first embodiment are formed in a stripe shape extending in the X-direction. The first light emitting layer 56b and the second light emitting layer 56g according to the first embodiment are formed to be alternately arranged in the Y-direction. The first light emitting layer 56b and the second light emitting layer 56g according to the first embodiment are arranged so that a width W11 in the Y-direction of the first light emitting layer 56b and a width W12 in the Y-direction of the second light emitting layer 56g are fit in a width W1 in the Y-direction of one pixel 31.

The pixel 31 includes the first sub-pixel 32R, the second sub-pixel 32G, and the third sub-pixel 32B of three different colors. Each of the first sub-pixel 32R and the third sub-pixel 32B has a shape different from that of the second sub-pixel 32G. In the pixel 31, a column including the second sub-pixel 32G and a column including the first sub-pixel 32R and the third sub-pixel 32B are arrayed as two columns of sub-pixels. In the pixel 31, an area occupied by the first sub-pixel 32R, the second sub-pixel 32G, and the third sub-pixel 32B has substantially a rectangular shape.

The color conversion layer 63 can absorb light of one or more wavelength bands in the first light emitting layer 56b and the second light emitting layer 56g, and emit light of a wavelength longer than that of the absorbed light.

Figure 7:
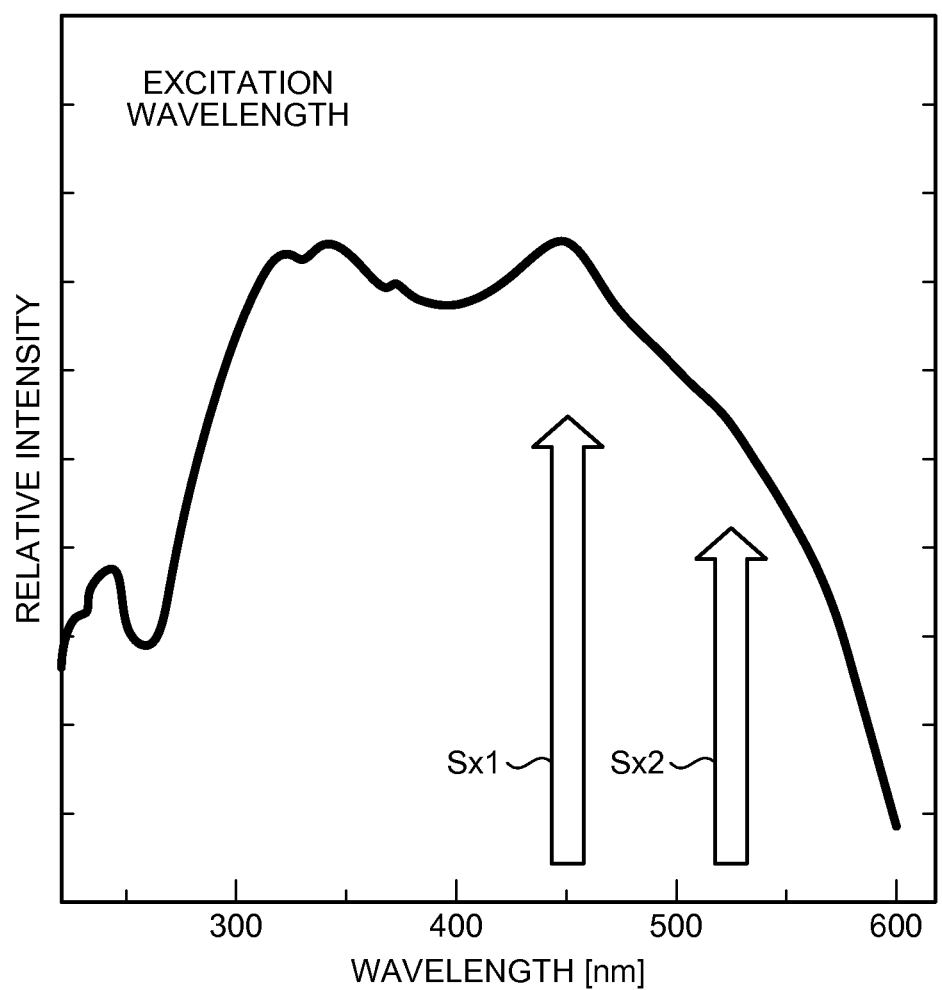
FIG. 7 is a diagram illustrating an example of a relation between a relative intensity distribution and an excitation wavelength of a color conversion layer according to the first embodiment.
Figure 8:
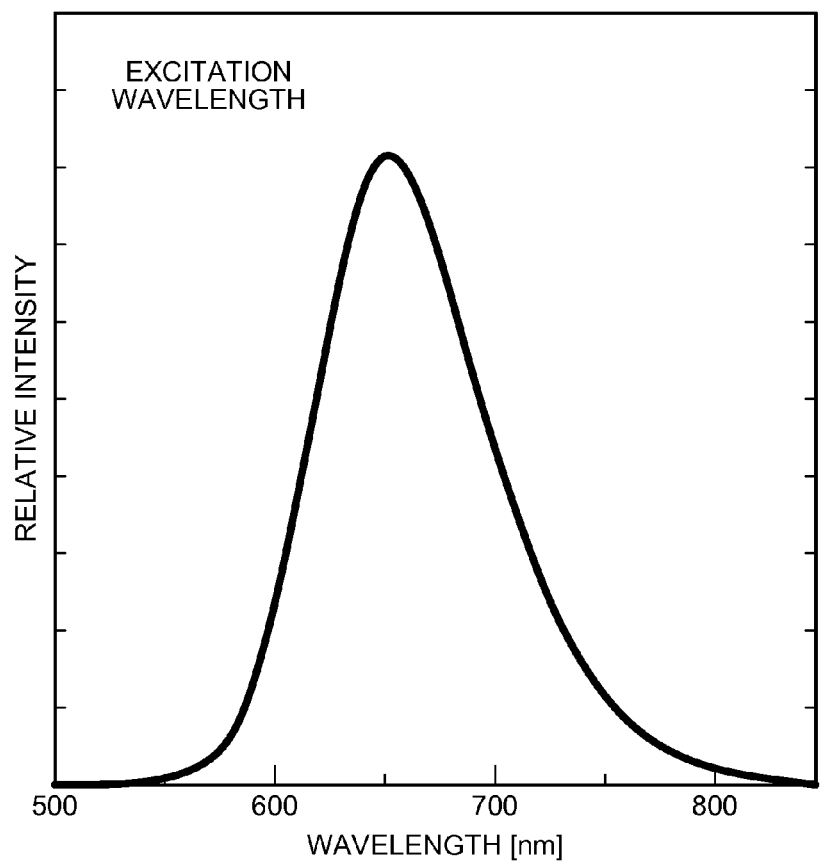
FIG. 8 is a diagram illustrating an example of a relation between the relative intensity distribution and an emission wavelength of the color conversion layer according to the first embodiment.

More specifically, the color conversion layer 63 is a fluorescent substance using a nitride as a base material and including a rare earth element as an activator to absorb light of a wavelength band of blue (about 450 nm) and emit light of a wavelength longer than that of the absorbed light. Examples of a material of the color conversion layer 63 include an Eu-activated sulfide-based red fluorescent substance ($CaAlSiN_3$:Eu). FIG. 7 is a diagram illustrating an example of a relation between a relative intensity distribution and an excitation wavelength of the color conversion layer according to the first embodiment. FIG. 8 is a diagram illustrating an example of a relation between the relative intensity distribution and an emission wavelength of the color conversion layer according to the first embodiment. As illustrated in FIG. 7, when the color conversion layer 63 is the Eu-activated sulfide-based red fluorescent substance, the color conversion layer 63 can absorb and excite light Sx1 of the wavelength band of blue (about 450 nm), and can absorb and excite light Sx2 of a wavelength band of green (about 550 nm). For example, as illustrated in FIG. 8, the color conversion layer 63 can absorb the light Sx1 of the wavelength band of blue (about 450 nm) and emit light of a wavelength band of red (about 650 nm).

For example, the color conversion layer 63 may be a fluorescent substance using an oxide as a base material and including a rare earth element as an activator to absorb the light of the wavelength band of blue (about 450 nm) and emit light of the wavelength longer than that of the absorbed light. Examples of the material of the fluorescent substance include a yellow fluorescent substance ($Y_3Al_5O12$:Ce, $Tb_3Al_5O1_2$:Ce), a green fluorescent substance ($Ca_3Sc_2Si_3O_{12}$:Ce), and a yellow fluorescent substance ($(Sr,Ca,Ba)_2SiO_4$:Eu).

The color conversion layer 63 may be a fluorescent substance using a sulfide as a base material and including a rare earth element as an activator to absorb the light of the wavelength band of blue (about 450 nm) and emit light of the wavelength longer than that of the absorbed light. Examples of the material of the fluorescent substance include a red fluorescent substance ($(Ca,Sr)S$:Eu) and a green fluorescent substance ($(Ca,Sr,Ba)Ga_2S_4$:Eu).

As described above, the color conversion layer 63 can absorb the light Sx1 of the wavelength band of blue (about 450 nm) and emit the light of the wavelength of red (about 650 nm). The color conversion layer 63 may also absorb external light entered from the substrate 50 side, and emit light of another wavelength. Therefore, in the image display unit 30, a surface on an emitting side of the color conversion layer 63 is covered with the color filter 61R.

Figure 9:
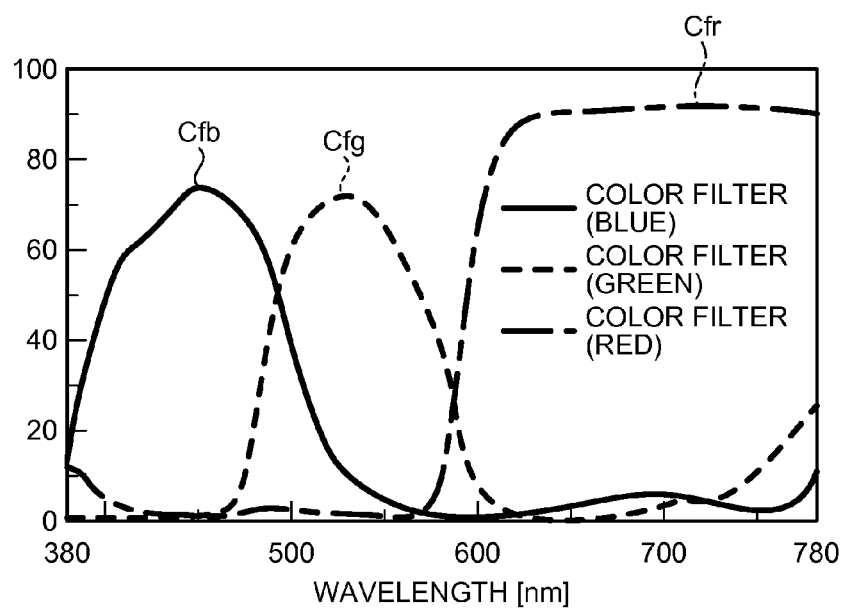
FIG. 9 is a diagram illustrating a relation between a transmission spectrum and a wavelength of the filter according to the first embodiment.

FIG. 9 is a diagram illustrating a relation between a transmission spectrum and the wavelength of the filter according to the first embodiment. In FIG. 9, a vertical axis indicates transmittance in terms of percentage, and a horizontal axis indicates the wavelength. A transmission spectrum Cfr of the color filter 61R can transmit a longer wavelength as compared with a transmission spectrum Cfb of the color filter (blue) and a transmission spectrum Cfg of the color filter (green). For example, the transmission spectrum Cfr of the color filter 61R transmits the wavelength of 600 nm or more. The color filter 61R is a filter layer, and can limit the wavelength to be transmitted to the emitting side of the color conversion layer 63.

As described above, the display device 100 includes the substrate 51, the first light emitting layer 56b, the second light emitting layer 56g, and the color conversion layer 63. The first light emitting layer 56b is formed to extend in the X-direction along the columns of the sub-pixels 32 arranged in a matrix on the substrate 51. The second light emitting layer 56g extends in the same direction as the first light emitting layer 56b, is arranged alternately with the first light emitting layer 56b in the Y-direction, and emits light of a wavelength different from that of the first light emitting layer 56b. The color conversion layer 63 is arranged at a position for covering at least part of the first light emitting layer 56b, absorbs light emitted from the first light emitting layer 56b, and converts the absorbed light so that the wavelength thereof becomes longer.

With this structure, the display device 100 can represent colors of three different main wavelength bands with two light emitting layers the number of which is smaller than three, which is the number of the sub-pixels 32 included in the pixel 31. Different light emitting layers are not used for respective light emitting colors, so that the area for each sub-pixel can be secured even when the number of pixels in the entire panel is increased, and light emission quantity can be prevented from being lowered.

Second Embodiment

Figure 10:
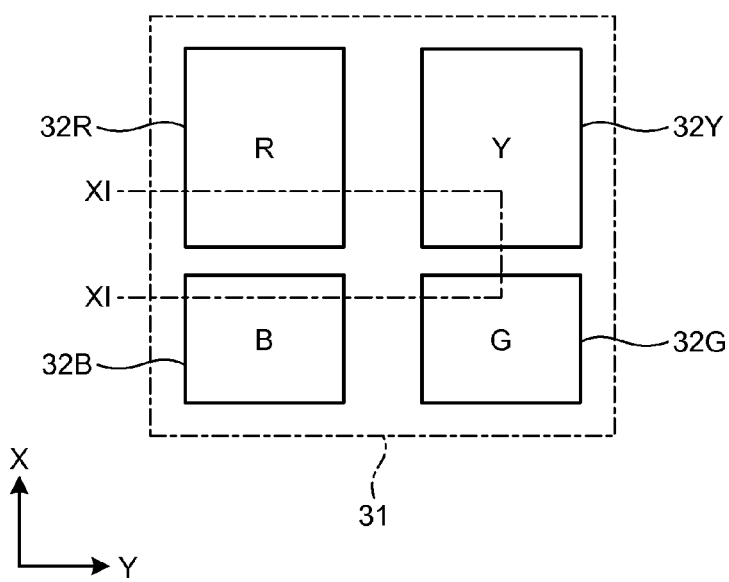
FIG. 10 is a diagram illustrating an array of sub-pixels of an image display unit according to a second embodiment.
Figure 11:
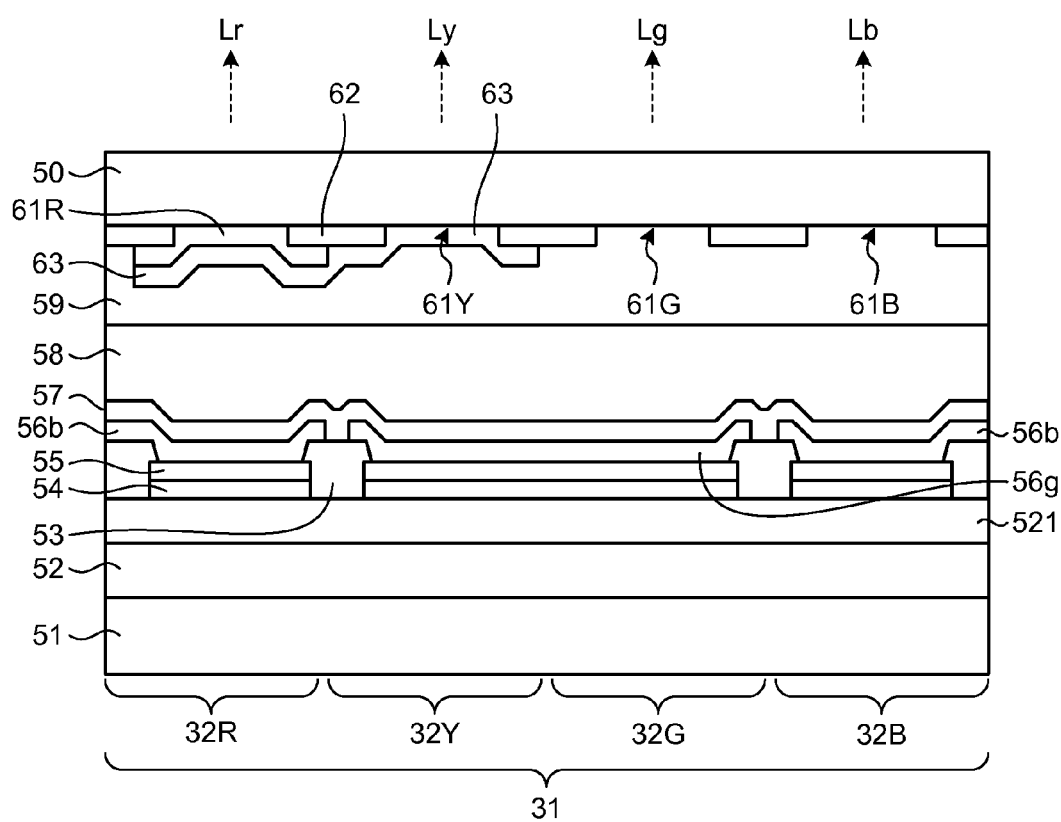
FIG. 11 is a diagram illustrating a cross-sectional structure of the image display unit according to the second embodiment.
Figure 12:
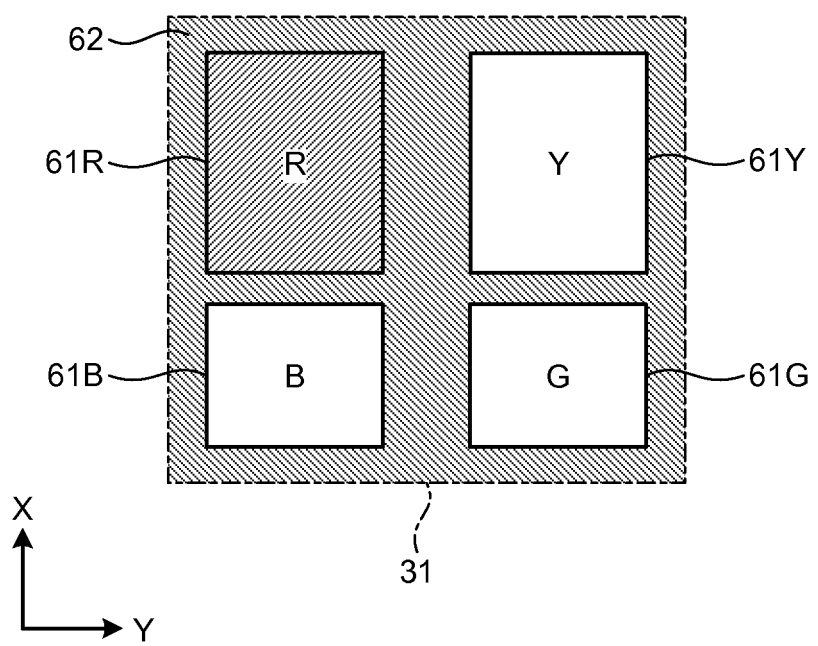
FIG. 12 is a diagram illustrating an array of filters or openings of a counter substrate according to the second embodiment.
Figure 13:
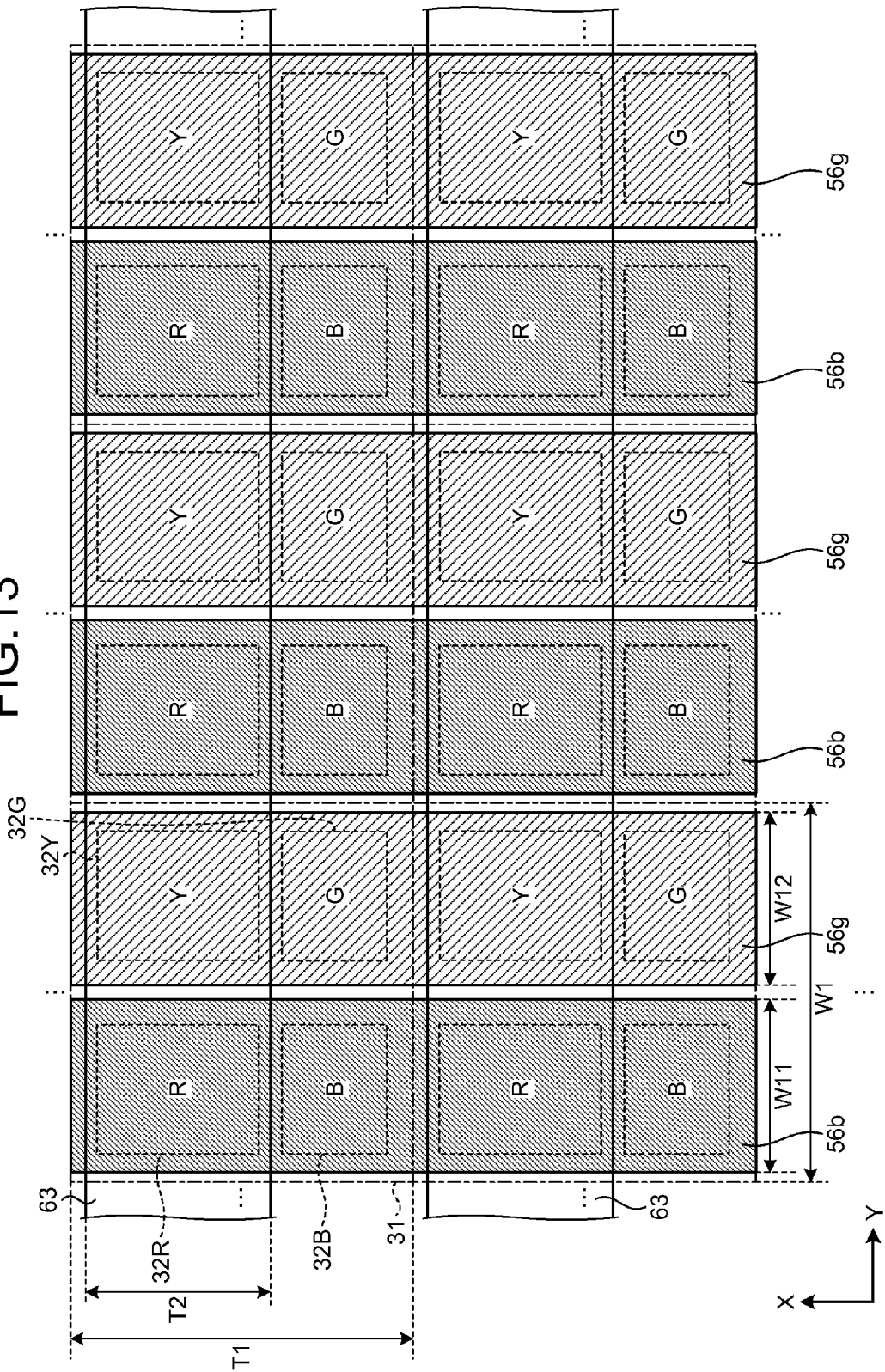
FIG. 13 is a schematic diagram illustrating a planar arrangement of a first light emitting layer and a second light emitting layer according to the second embodiment.

FIG. 10 is a diagram illustrating the array of sub-pixels of the image display unit according to a second embodiment. FIG. 11 is a diagram illustrating a cross-sectional structure of the image display unit according to the second embodiment. FIG. 11 illustrates a cross-sectional structure representing a XI-XI cross section in FIG. 10. FIG. 12 is a diagram illustrating an array of filters or openings of the counter substrate according to the second embodiment. FIG. 13 is a schematic diagram illustrating a planar arrangement of the first light emitting layer and the second light emitting layer according to the second embodiment. The same components as those described in the embodiment described above are denoted by the same reference numerals, and redundant description will not be repeated. In the following second embodiment to ninth embodiment, the signal processing unit 20 illustrated in FIG. 1 converts the red (R) component that is the first color component, the green (G) component that is the second color component, and the blue (B) component that is the third color component into four different color components that can be displayed by the first sub-pixel, the second sub-pixel, the third sub-pixel, and the fourth sub-pixel, based on the first color information in the input image signal.

As illustrated in FIG. 10, for example, the pixel 31 includes the first sub-pixel 32R, the second sub-pixel 32G, the third sub-pixel 32B, and the fourth sub-pixel 32Y. The first sub-pixel 32R emits light of the first color (for example, the red (R) component). The second sub-pixel 32G emits light of the second color (for example, the green (G) component). The third sub-pixel 32B emits light of the third color (for example, the blue (B) component). The fourth sub-pixel 32Y emits light of a fourth color (for example, a yellow (Y) component). In the following description, when it is not necessary to distinguish the first sub-pixel 32R, the second sub-pixel 32G, the third sub-pixel 32B, and the fourth sub-pixel 32Y from one another, they are collectively referred to as the sub-pixels 32.

As illustrated in FIG. 11, the image display unit 30 includes the color conversion layer 63 and the color filter 61R for transmitting the first color light Lr among the light emitting components of the first light emitting layer 56b, which are arranged between the first light emitting layer 56b and the image observer. Similarly, the color conversion layer 63 is arranged at an opening 61Y between the second light emitting layer 56g and the image observer for transmitting fourth color light Ly among the light emitting components of the second light emitting layer 56g.

The image display unit 30 also includes the opening 61G through which the light emitting component of the second light emitting layer 56g can be emitted to the image observer. The image display unit 30 also includes the opening 61B through which the light emitting component of the first light emitting layer 56b can be emitted to the image observer. Each of the opening 61Y, the opening 61G, and the opening 61B may include a transparent resin layer or a color filter for transmitting a color corresponding to each of the openings. In this way, the opening 61Y, the opening 61G, and the opening 61B can prevent a large level difference from being generated in the insulating layer 59 by providing a transparent resin layer. The first color light Lr, the second color light Lg, the third color light Lb, and the fourth color light Ly illustrated in FIG. 11 are emitted from the substrate 50 to the observer while passing through the color filter 61R, the opening 61G, the opening 61B, and the opening 61Y illustrated in FIG. 12.

As illustrated in FIG. 7, the color conversion layer 63 positioned at the first sub-pixel 32R can absorb the light Sx1 of the wavelength band of blue (about 450 nm) and emit light of the wavelength of red (about 650 nm). The light of the wavelength passing through the color conversion layer 63 includes the light Sx1 of the wavelength band of blue (about 450 nm), so that the image display unit 30 covers the surface on the emitting side of the color conversion layer 63 with the color filter 61R. Therefore, regarding the first color light Lr, the light of the wavelength of red (about 650 nm) passes through the color filter 61R, and the light of the wavelength band of blue (about 450 nm) is suppressed.

As illustrated in FIG. 7, when the color conversion layer 63 is an Eu-activated sulfide-based red fluorescent substance, the color conversion layer 63 can absorb and excite the light Sx1 of the wavelength band of blue (about 450 nm), and can absorb and excite the light Sx2 of the wavelength band of green (about 550 nm). The emission spectrum of the color conversion layer 63 excited with the light Sx2 is basically the same as a case of using the light Sx1 illustrated in FIG. 8. In this case, the yellow component is a combination of a light component that is not absorbed in the emission spectrum of the color conversion layer excited with the light Sx2 and a component after color conversion (refer to FIG. 8). Therefore, the color conversion layer 63 positioned at the fourth sub-pixel 32Y can absorb the light Sx2 of the wavelength band of green (about 550 nm) and emit the light of the wavelength of yellow (about 580 nm).

As illustrated in FIG. 13, the first light emitting layer 56b and the second light emitting layer 56g according to the second embodiment are formed in a stripe shape extending in the X-direction. The first light emitting layer 56b and the second light emitting layer 56g according to the second embodiment are formed to be alternately arranged in the Y-direction. The first light emitting layer 56b and the second light emitting layer 56g according to the second embodiment are arranged so that the width W11 in the Y-direction of the first light emitting layer 56b and the width W12 in the Y-direction of the second light emitting layer 56g are fit in the width W1 in the Y-direction of one pixel 31.

The pixel 31 includes the first sub-pixel 32R, the second sub-pixel 32G, the third sub-pixel 32B, and the fourth sub-pixel 32Y of four different colors. In one pixel 31, the first sub-pixel 32R and the third sub-pixel 32B are arranged in the same column. In one pixel 31, the second sub-pixel 32G and the fourth sub-pixel 32Y are arranged in the same column. In one pixel 31, the entire area occupied by the first sub-pixel 32R, the second sub-pixel 32G, the third sub-pixel 32B, and the fourth sub-pixel 32Y has substantially a rectangular shape. In one pixel 31, the first sub-pixel 32R and the second sub-pixel 32G are diagonally arranged to be in different columns.
Similarly, in one pixel 31, the third sub-pixel 32B and the fourth sub-pixel 32Y are diagonally arranged to be in different columns. Therefore, first sub-pixels 32R are arranged on both adjacent sides in the X-direction of the third sub-pixel 32B, and fourth sub-pixels 32Y are arranged on both adjacent sides in the X-direction of the second sub-pixel 32G. The fourth sub-pixels 32Y are arranged on both adjacent sides in the Y-direction of the first sub-pixel 32R, and second sub-pixels 32G are arranged on both adjacent sides in the Y-direction of the third sub-pixel 32B. As described above, one pixel 31 is formed of two rows and two columns of the sub-pixels 32, and the shape of the entire pixel 31 is a rectangle.

As illustrated in FIG. 13, the color conversion layer 63 according to the second embodiment is formed in a stripe shape extending in the Y-direction. In this way, the direction in which the color conversion layer 63 is formed intersects with the direction in which the first light emitting layer 56b and the second light emitting layer 56g are formed. A length T2 in the X-direction of the color conversion layer 63 is smaller than a length T1 of the pixel 31. Therefore, the same color conversion layer 63 covers part of the first light emitting layer 56b and the second light emitting layer 56g. In other words, the same color conversion layer 63 overlaps with part of the first light emitting layer 56b and the second light emitting layer 56g in a plan view. Accordingly, the sub-pixels 32 covered with the color conversion layer 63 and the sub-pixels 32 not covered with the color conversion layer 63 are arranged side by side along the X-direction. As a result, as compared with a case of forming the color conversion layer 63 for each sub-pixel 32, there is an allowance in alignment accuracy for being overlapped with the first light emitting layer 56b and the second light emitting layer 56g in forming the color conversion layer 63. In the pixel 31 according to the second embodiment, even when the width W1 in the Y-direction of the pixel 31 is narrowed, there is an allowance in the width W11 in the Y-direction of the first light emitting layer 56b and the width W12 in the Y-direction of the second light emitting layer 56g. As a result, even when accuracy of the pixel 31 is increased, the width W11 in the Y-direction of the first light emitting layer 56b and the width W12 in the Y-direction of the second light emitting layer 56g can be secured, and the area for one sub-pixel 32 can be secured. The area for each sub-pixel 32 can be secured even when the accuracy of the image display unit 30 is increased, so that the light emission quantity of the self-luminous body can be prevented from being lowered.

In the second embodiment, the area of the first sub-pixel 32R is larger than that of the third sub-pixel 32B. Similarly, the area of the fourth sub-pixel 32Y is larger than that of the second sub-pixel 32G. In other words, the area of the sub-pixel 32 covered with the color conversion layer 63 is larger than that of the sub-pixel not covered with the color conversion layer 63. With this structure, the first sub-pixel 32R can compensate for light quantity that is attenuated by the color conversion layer 63 and the color filter 61R as compared with the third sub-pixel 32B. The fourth sub-pixel 32Y can compensate for the light quantity that is attenuated by the color conversion layer 63 as compared with the second sub-pixel 32G. An electric potential of the power supply line PCL to be applied to each of the first sub-pixel 32R, the second sub-pixel 32G, the third sub-pixel 32B, and the fourth sub-pixel 32Y can be the same.

As described above, the display device 100 includes the substrate 51, the first light emitting layer 56b, the second light emitting layer 56g, and the color conversion layer 63. The first light emitting layer 56b is formed to extend in the X-direction along the columns of the sub-pixels 32 arranged in a matrix on the substrate 51. The second light emitting layer 56g extends in the same direction as the first light emitting layer 56b, is arranged alternately with the first light emitting layer 56b in the Y-direction, and emits light of a wavelength different from that of the first light emitting layer 56b. The color conversion layer 63 extends in the Y-direction to be arranged at a position for covering part of the first light emitting layer 56b and the second light emitting layer 56g. The color conversion layer 63 absorbs light emitted from the first light emitting layer 56b, and converts the absorbed light so that the wavelength thereof becomes longer. The color conversion layer 63 also absorbs light emitted from the second light emitting layer 56g, and converts the absorbed light so that the wavelength thereof becomes longer. The color conversion layer 63 is arranged in a form of a plurality of stripes, and adjacent color conversion layers 63 are arranged to have a gap therebetween in the X-direction.

With this structure, the display device 100 can represent colors of four different main wavelength bands with two light emitting layers the number of which is smaller than four, which is the number of the sub-pixels 32 included in the pixel 31. Different light emitting layers are not used for respective light emitting colors, so that the area for each sub-pixel can be secured even when the number of pixels in the entire panel is increased, and the light emission quantity can be prevented from being lowered.

Third Embodiment

Figure 14:
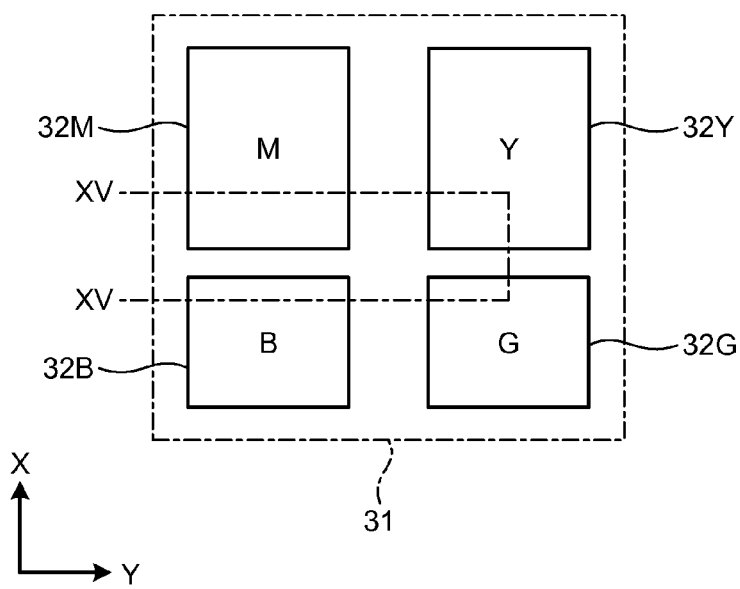
FIG. 14 is a diagram illustrating an array of sub-pixels of an image display unit according to a third embodiment.
Figure 15:
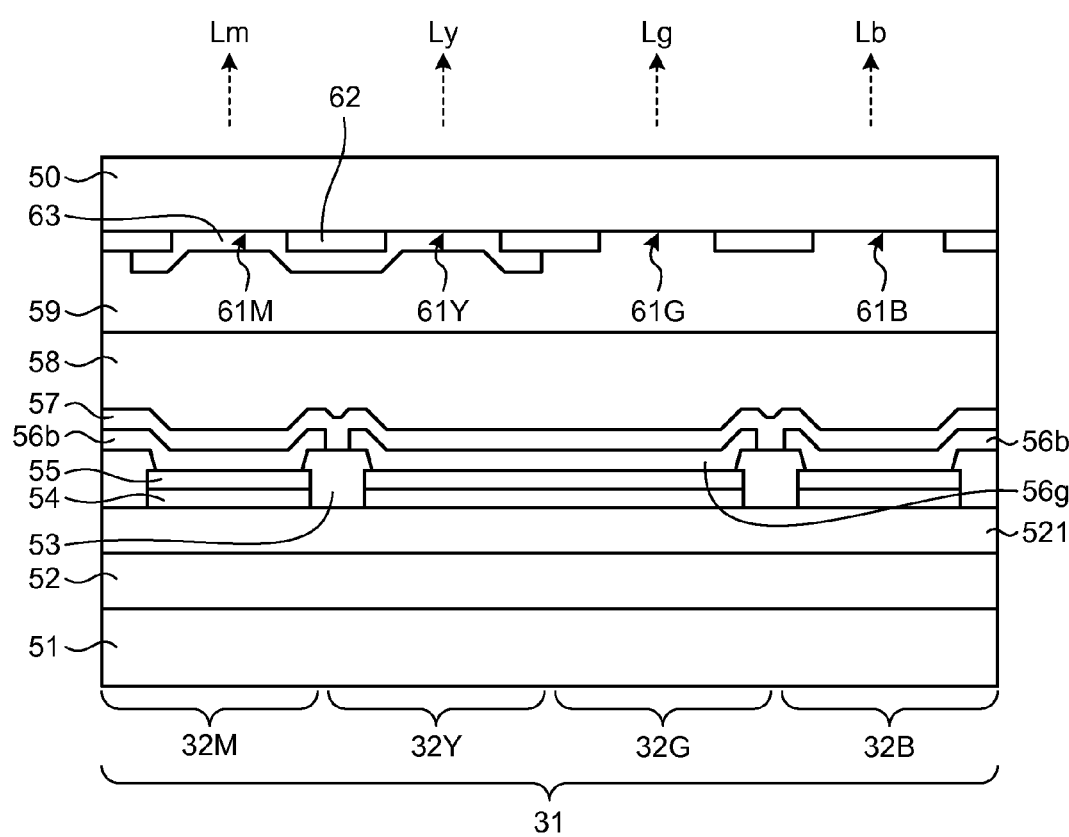
FIG. 15 is a diagram illustrating a cross-sectional structure of the image display unit according to the third embodiment.
Figure 16:
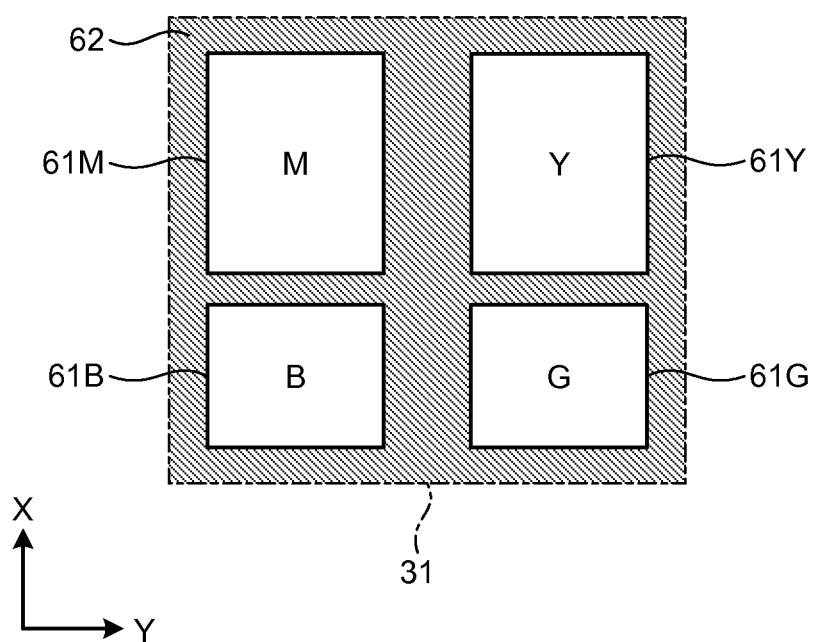
FIG. 16 is a diagram illustrating an array of filters or openings of a counter substrate according to the third embodiment.
Figure 17:
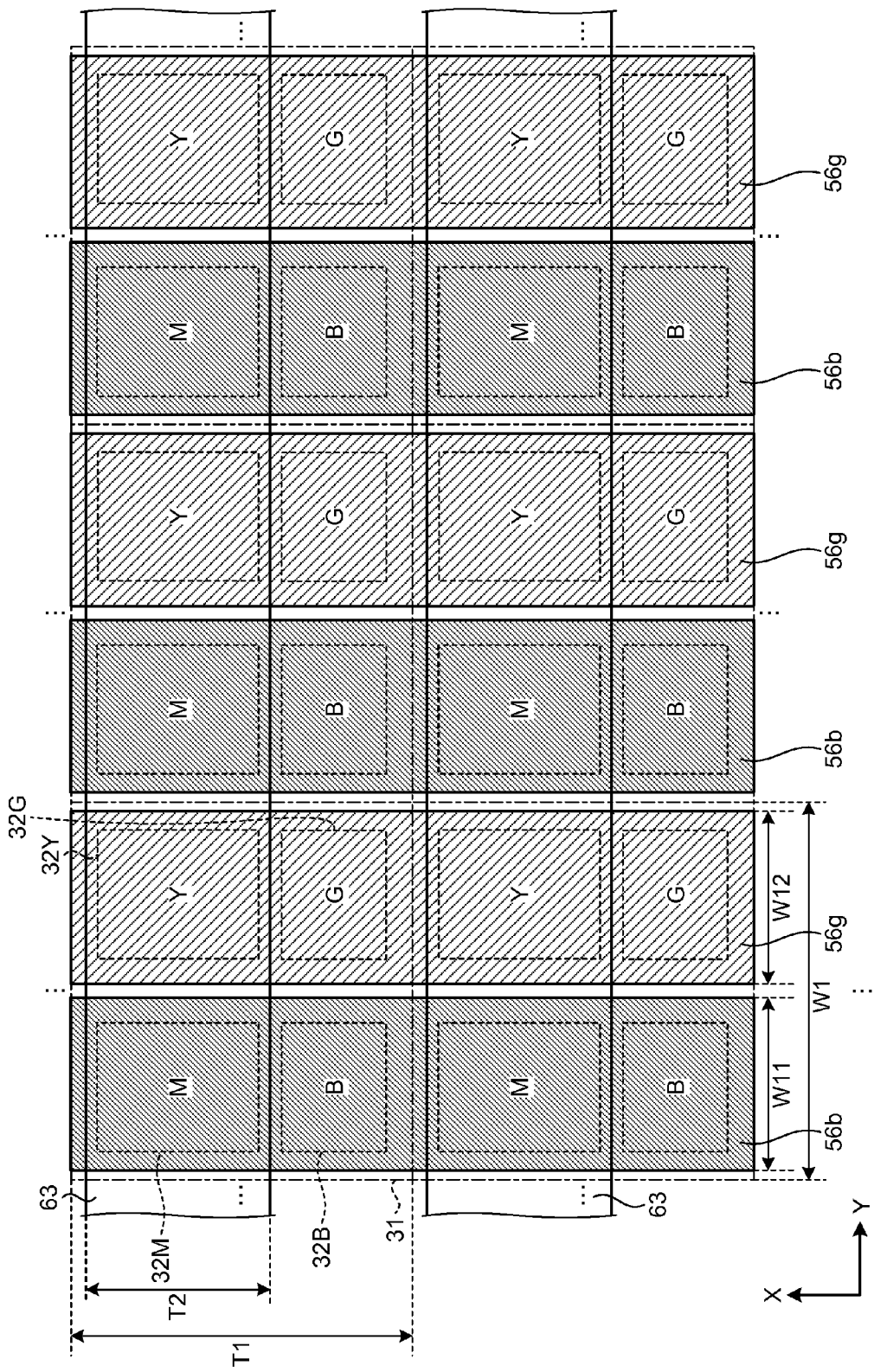
FIG. 17 is a schematic diagram illustrating a planar arrangement of a first light emitting layer and a second light emitting layer according to the third embodiment.

FIG. 14 is a diagram illustrating the array of sub-pixels of the image display unit according to a third embodiment. FIG. 15 is a diagram illustrating a cross-sectional structure of the image display unit according to the third embodiment. FIG. 15 illustrates a cross-sectional structure representing a XV-XV cross section in FIG. 14. FIG. 16 is a diagram illustrating the array of filters or openings of the counter substrate according to the third embodiment. FIG. 17 is a schematic diagram illustrating a planar arrangement of the first light emitting layer and the second light emitting layer according to the third embodiment. The same components as those described in the embodiments described above are denoted by the same reference numerals, and redundant description will not be repeated.

As illustrated in FIG. 14, for example, the pixel 31 includes a first sub-pixel 32M, the second sub-pixel 32G, the third sub-pixel 32B, and the fourth sub-pixel 32Y. The first sub-pixel 32M emits light of the first color (for example, a magenta (M) component). The second sub-pixel 32G emits light of the second color (for example, the green (G)

component). The third sub-pixel 32B emits light of the third color (for example, the blue (B) component). The fourth sub-pixel 32Y emits light of the fourth color (for example, the yellow (Y) component). In the following description, when it is not necessary to distinguish the first sub-pixel 32M, the second sub-pixel 32G, the third sub-pixel 32B, and the fourth sub-pixel 32Y from each other, they are collectively referred to as the sub-pixels 32.

As illustrated in FIG. 15, in the image display unit 30, the color conversion layer 63 is arranged at an opening 61M between the first light emitting layer 56b and the image observer for transmitting first color light Lm among the light emitting components of the first light emitting layer 56b. Similarly, the color conversion layer 63 is arranged at the opening 61Y between the second light emitting layer 56g and the image observer for transmitting the fourth color light Ly among the light emitting components of the second light emitting layer 56g.

The image display unit 30 also includes the opening 61G through which the light emitting component of the second light emitting layer 56g can be emitted to the image observer. The image display unit 30 also includes the opening 61B through which the light emitting component of the first light emitting layer 56b can be emitted to the image observer. Each of the opening 61M, the opening 61Y, the opening 61G, and the opening 61B may include a transparent resin layer or a color filter for transmitting a color corresponding to each of the openings. In this way, the opening 61M, the opening 61Y, the opening 61G, and the opening 61B can prevent a large level difference from being generated in the insulating layer 59 by providing a transparent resin layer. The first color light Lm, the second color light Lg, the third color light Lb, and the fourth color light Ly illustrated in FIG. 15 are emitted from the substrate 50 to the observer while passing through the opening 61M, the opening 61G, the opening 61B, and the opening 61Y illustrated in FIG. 16.

As illustrated in FIG. 7, the color conversion layer 63 positioned at the first sub-pixel 32M can absorb the light Sx1 of the wavelength band of blue (about 450 nm) and emit light of the wavelength of red (about 650 nm). The color of the first color light Lm is magenta obtained by mixing the wavelength band of blue (about 450 nm) and the wavelength band of red (about 650 nm). As illustrated in FIG. 7, when the color conversion layer 63 is an Eu-activated sulfide-based red fluorescent substance, the color conversion layer 63 can absorb and excite the light Sx1 of the wavelength band of blue (about 450 nm), and can absorb and excite the light Sx2 of the wavelength band of green (about 550 nm). Therefore, the color conversion layer 63 positioned at the fourth sub-pixel 32Y can absorb the light Sx2 of the wavelength band of green (about 550 nm) and emit the light of the wavelength of red (about 650 nm). The fourth color light Ly becomes light of a wavelength of yellow (about 580 nm) obtained by mixing the wavelength band of green (about 550 nm) and the wavelength band of red (about 650 nm).

As illustrated in FIG. 17, the first light emitting layer 56b and the second light emitting layer 56g according to the third embodiment are formed in a stripe shape extending in the X-direction. The first light emitting layer 56b and the second light emitting layer 56g according to the third embodiment are formed to be alternately arranged in the Y-direction. The first light emitting layer 56b and the second light emitting layer 56g according to the third embodiment are arranged so that the width W11 in the Y-direction of the first light emitting layer 56b and the width W12 in the Y-direction of the second light emitting layer 56g are fit in the width W1 in the Y-direction of one pixel 31.

The pixel 31 includes the first sub-pixel 32M, the second sub-pixel 32G, the third sub-pixel 32B, and the fourth sub-pixel 32Y of four different colors. In one pixel 31, the first sub-pixel 32M and the third sub-pixel 32B are arranged in the same column. In one pixel 31, the second sub-pixel 32G and the fourth sub-pixel 32Y are arranged in the same column. In one pixel 31, the entire area occupied by the first sub-pixel 32M, the second sub-pixel 32G, the third sub-pixel 32B, and the fourth sub-pixel 32Y has substantially a rectangular shape. In one pixel 31, the first sub-pixel 32M and the second sub-pixel 32G are diagonally arranged to be in different columns. Similarly, in one pixel 31, the third sub-pixel 32B and the fourth sub-pixel 32Y are diagonally arranged to be in different columns. Therefore, first sub-pixels 32M are arranged on both adjacent sides in the X-direction of the third sub-pixel 32B, and the fourth sub-pixels 32Y are arranged on both adjacent sides in the X-direction of the second sub-pixel 32G. The fourth sub-pixels 32Y are arranged on both adjacent sides in the Y-direction of the first sub-pixel 32M, and the second sub-pixels 32G are arranged on both adjacent sides in the Y-direction of the third sub-pixel 32B. As described above, one pixel 31 is formed of two rows and two columns of the sub-pixels 32, and the shape of the entire pixel 31 is a rectangle.

As illustrated in FIG. 17, the color conversion layer 63 according to the third embodiment is formed in a stripe shape extending in the Y-direction. In this way, the direction in which the color conversion layer 63 is formed intersects with the direction in which the first light emitting layer 56b and the second light emitting layer 56g are formed. The length T2 in the X-direction of the color conversion layer 63 is smaller than the length T1 of the pixel 31. Therefore, the same color conversion layer 63 covers part of the first light emitting layer 56b and the second light emitting layer 56g. In other words, the same color conversion layer 63 overlaps with part of the first light emitting layer 56b and the second light emitting layer 56g in a plan view. As a result, as compared with a case of forming the color conversion layer 63 for each sub-pixel 32, there is an allowance in the alignment accuracy for being overlapped with the first light emitting layer 56b and the second light emitting layer 56g in forming the color conversion layer 63. In the pixel 31 according to the third embodiment, even when the width W1 in the Y-direction of the pixel 31 is narrowed, there is an allowance in the width W11 in the Y-direction of the first light emitting layer 56b and the width W12 in the Y-direction of the second light emitting layer 56g. As a result, even when the accuracy of the pixel 31 is increased, the width W11 in the Y-direction of the first light emitting layer 56b and the width W12 in the Y-direction of the second light emitting layer 56g can be secured, and the area for one sub-pixel 32 can be secured. The area for each sub-pixel 32 can be secured even when the accuracy of the image display unit 30 is increased, so that the light emission quantity of the self-luminous body can be prevented from being lowered.

In the third embodiment, the area of the first sub-pixel 32M is larger than that of the third sub-pixel 32B. Similarly, the area of the fourth sub-pixel 32Y is larger than that of the second sub-pixel 32G. In other words, the area of the sub-pixel 32 covered with the color conversion layer 63 is larger than that of the sub-pixel 32 not covered with the color conversion layer 63. With this structure, the first sub-pixel 32M can compensate for the light quantity that is attenuated by the color conversion layer 63 as compared with the third sub-pixel 32B. The fourth sub-pixel 32Y can compensate for the light quantity that is attenuated by the color conversion layer 63 as compared with the second sub-pixel 32G. The electric potential of the power supply line PCL to be applied to each of the first sub-pixel 32M, the second sub-pixel 32G, the third sub-pixel 32B, and the fourth sub-pixel 32Y can be the same.

Fourth Embodiment

Figure 18:
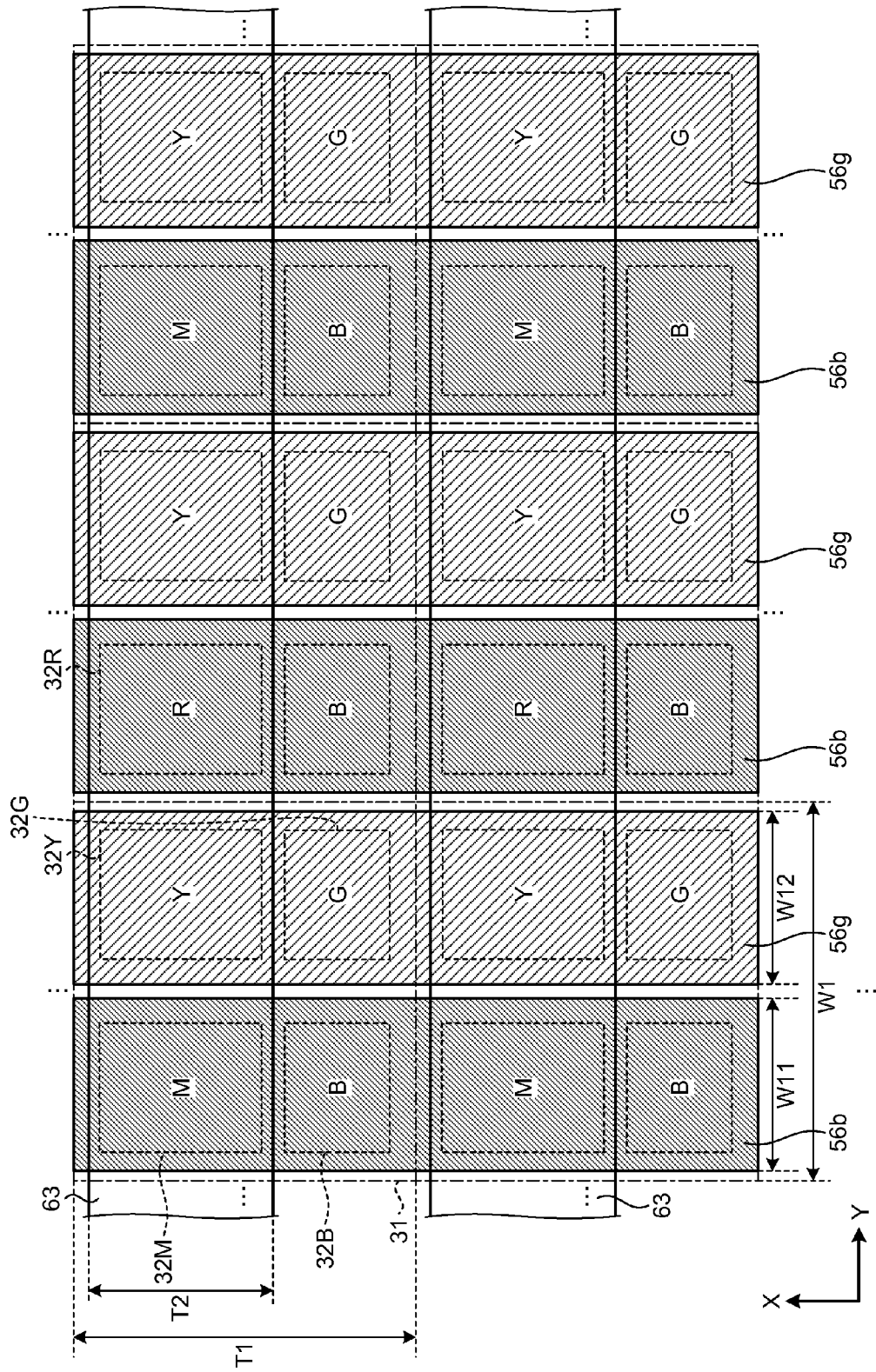
FIG. 18 is a schematic diagram illustrating a planar arrangement of a first light emitting layer and a second light emitting layer according to a fourth embodiment.

FIG. 18 is a schematic diagram illustrating a planar arrangement of the first light emitting layer and the second light emitting layer according to a fourth embodiment. The same components as those described in the embodiments described above are denoted by the same reference numerals, and redundant description will not be repeated.

As illustrated in FIG. 18, in the image display unit 30 according to the fourth embodiment, the pixels 31 according to the second embodiment and the pixels 31 according to the third embodiment are alternately arranged in the Y-direction. In the conventional image display unit including the self-luminous body, when saturation of an input image is high and when the input image includes a complementary color, a pixel of additional primary color W cannot be used and power consumption of the display device may be increased. On the other hand, the image display unit 30 according to the fourth embodiment can suppress the power consumption, even when the saturation of the input image is high and when the input image includes the complementary color, by causing a sub-pixel of complementary color such as the first sub-pixel 32M and the fourth sub-pixel 32Y to emit light. The pixels 31 according to the second embodiment and the pixels 31 according to the third embodiment are alternately arranged in the Y-direction, so that the first sub-pixel 32M and the first sub-pixel 32R are arranged to hold the fourth sub-pixel 32Y that can perform high luminance display therebetween. As a result, a luminance center of gravity is hardly changed, so that display quality can be improved.

Fifth Embodiment

Figure 19:
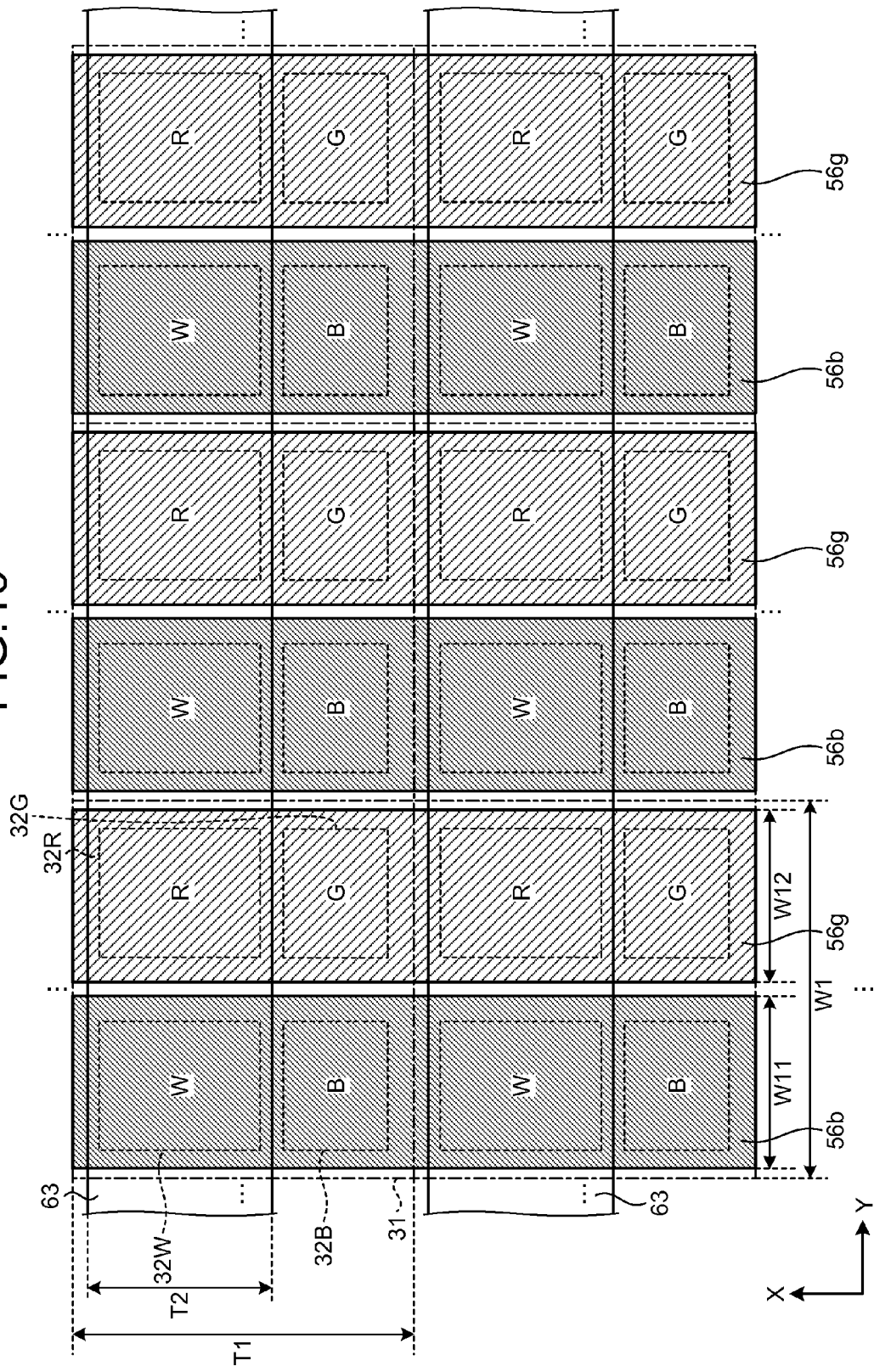
FIG. 19 is a schematic diagram illustrating a planar arrangement of a first light emitting layer and a second light emitting layer according to a fifth embodiment.

FIG. 19 is a schematic diagram illustrating a planar arrangement of the first light emitting layer and the second light emitting layer according to a fifth embodiment. The same components as those described in the embodiments described above are denoted by the same reference numerals, and redundant description will not be repeated.

As illustrated in FIG. 19, the pixel 31 includes the first sub-pixel 32R, the second sub-pixel 32G, the third sub-pixel 32B, and the fourth sub-pixel 32W of four different colors. In one pixel 31, the first sub-pixel 32R and the second sub-pixel 32G are arranged in the same column. In one pixel 31, the third sub-pixel 32B and the fourth sub-pixel 32W are arranged in the same column. In one pixel 31, the entire area occupied by the first sub-pixel 32R, the second sub-pixel 32G, the third sub-pixel 32B, and the fourth sub-pixel 32W has substantially a rectangular shape. In one pixel 31, the second sub-pixel 32G and the fourth sub-pixel 32W are diagonally arranged to be in different columns. Similarly, in one pixel 31, the third sub-pixel 32B and the first sub-pixel 32R are diagonally arranged to be in different columns. Therefore, fourth sub-pixels 32W are arranged on both adjacent sides in the X-direction of the third sub-pixel 32B, and the first sub-pixels 32R are arranged on both adjacent sides in the X-direction of the second sub-pixel 32G. The fourth sub-pixels 32W are arranged on both adjacent sides in the Y-direction of the first sub-pixel 32R, and the second sub-pixels 32G are arranged on both adjacent sides in the Y-direction of the third sub-pixel 32B. As described above, one pixel 31 is formed of two rows and two columns of the sub-pixels 32, and the shape of the entire pixel 31 is a rectangle.

As illustrated in FIG. 19, the color conversion layer 63 according to the fifth embodiment is formed in a stripe shape extending in the Y-direction. In this way, the direction in which the color conversion layer 63 is formed intersects with the direction in which the first light emitting layer 56b and the second light emitting layer 56g are formed. The length T2 in the X-direction of the color conversion layer 63 is smaller than the length T1 of the pixel 31. Therefore, the same color conversion layer 63 covers part of an upper part of the first light emitting layer 56b and the second light emitting layer 56g. As a result, as compared with a case of forming the color conversion layer 63 for each sub-pixel 32, there is an allowance in alignment accuracy for being overlapped with the first light emitting layer 56b and the second light emitting layer 56g in forming the color conversion layer 63. In the pixel 31 according to the fifth embodiment, even when the width W1 in the Y-direction of the pixel 31 is narrowed, there is an allowance in the width W11 in the Y-direction of the first light emitting layer 56b and the width W12 in the Y-direction of the second light emitting layer 56g. As a result, even when the accuracy of the pixel 31 is increased, the width W11 in the Y-direction of the first light emitting layer 56b and the width W12 in the Y-direction of the second light emitting layer 56g can be secured, and the area for one sub-pixel 32 can be secured. The area for each sub-pixel 32 can be secured even when the accuracy of the image display unit 30 is increased, so that the light emission quantity of the self-luminous body can be prevented from being lowered.

The color conversion layer 63 positioned at the fourth sub-pixel 32W can absorb light of the wavelength band of blue (about 450 nm), and emit light of the wavelength band ranging from red (about 650 nm) to green (about 550 nm). In addition to the light of blue from the first light emitting layer 56b, the light of the wavelength band ranging from red (about 650 nm) to green (about 550 nm) is added to and mixed with the light of the wavelength that passes through the color conversion layer 63 to emit light of white.

The color conversion layer 63 positioned at the first sub-pixel 32R can absorb the light of the wavelength band of green (about 550 nm), and emit light to include the light of the wavelength of red (about 650 nm). The color filter 61R covers the surface on the emitting side of the color conversion layer 63 positioned at the first sub-pixel 32R, so that the light of the wavelength of red (about 650 nm) of the first color light Lr is transmitted through the color filter 61R, and light of the other wavelength bands is suppressed.

The signal processing unit 20 illustrated in FIG. 1 described above separates the white (W) component from the color components (red (R), green (G), and blue (B)) included in the first color information of an input image signal SRGB to generate second color information, and determines lighting quantity of the fourth sub-pixel 32W. Accordingly, the power consumption of the image display unit 30 can be suppressed by increasing the lighting quantity of the fourth sub-pixel 32W having relatively higher luminance and reducing the lighting quantity of the first sub-pixel 32R, the second sub-pixel 32G, and the third sub-pixel 32B.

Sixth Embodiment

Figure 20:
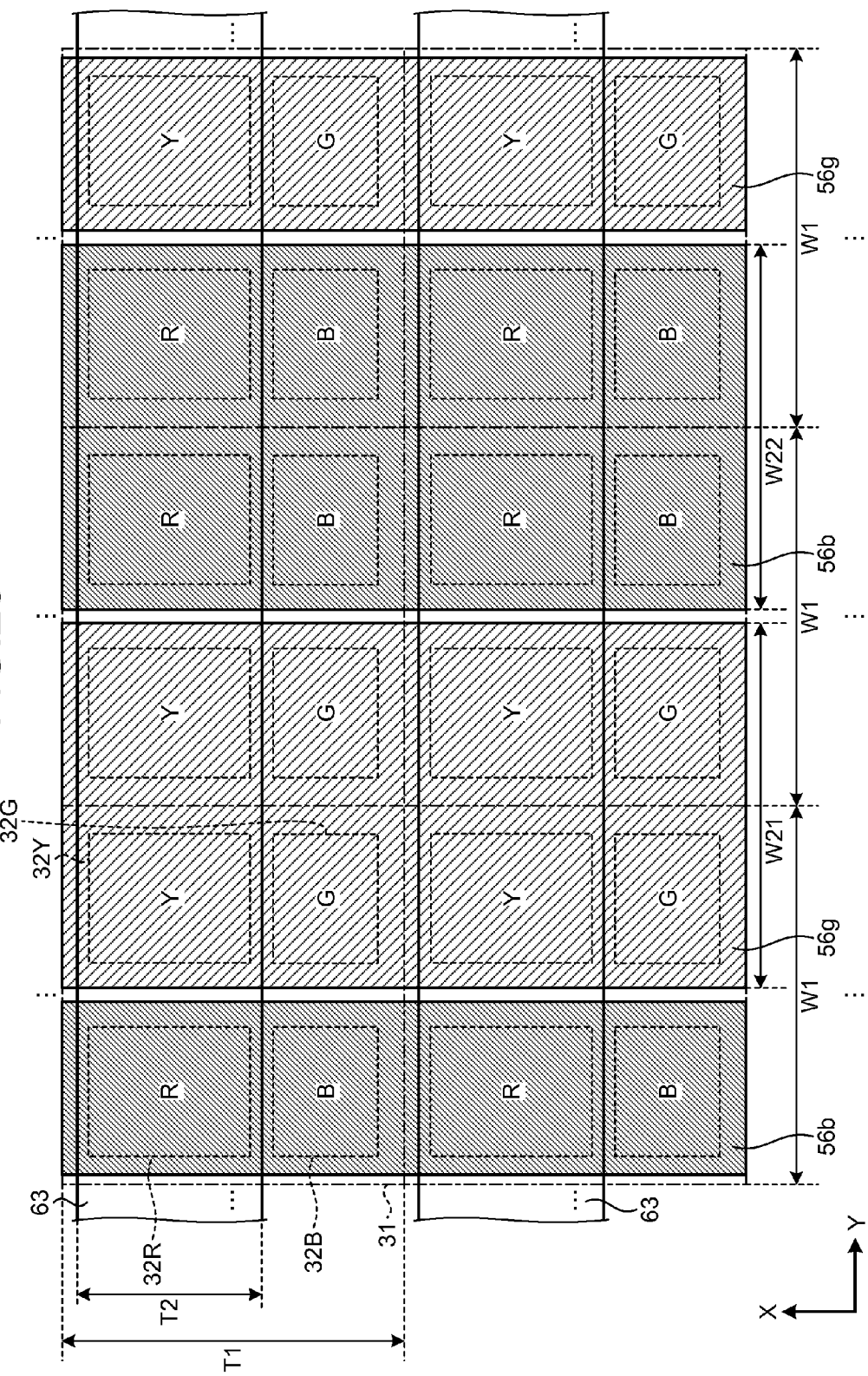
FIG. 20 is a schematic diagram illustrating a planar arrangement of a first light emitting layer and a second light emitting layer according to a sixth embodiment.

FIG. 20 is a schematic diagram illustrating a planar arrangement of the first light emitting layer and the second light emitting layer according to a sixth embodiment. The same components as those described in the embodiments described above are denoted by the same reference numerals, and redundant description will not be repeated.

As illustrated in FIG. 20, for example, the pixel 31 includes the first sub-pixel 32R, the second sub-pixel 32G, the third sub-pixel 32B, and the fourth sub-pixel 32Y. The first sub-pixel 32R emits light of the first color (for example, the red (R) component). The second sub-pixel 32G emits light of the second color (for example, the green (G) component). The third sub-pixel 32B emits light of the third color (for example, the blue (B) component). The fourth sub-pixel 32Y emits light of the fourth color (for example, the yellow (Y) component). In the following description, when it is not necessary to distinguish the first sub-pixel 32R, the second sub-pixel 32G, the third sub-pixel 32B, and the fourth sub-pixel 32Y from one another, they are collectively referred to as the sub-pixels 32.

The arrangement of the first sub-pixels 32R, the second sub-pixels 32G, the third sub-pixels 32B, and the fourth sub-pixels 32Y in adjacent pixels 31 is linearly symmetric with respect to the X-direction, i.e., the direction in which the first light emitting layer 56b and the second light emitting layer 56g extend.

As illustrated in FIG. 20, the first light emitting layer 56b and the second light emitting layer 56g according to the sixth embodiment are formed in a stripe shape extending in the X-direction. The first light emitting layer 56b and the second light emitting layer 56g according to the sixth embodiment are alternately formed in the Y-direction. The first light emitting layer 56b according to the sixth embodiment is arranged so that a width W22 in the Y-direction thereof is larger than the width in the Y-direction of one sub-pixel 32 and is equal to or smaller than the width W1 of the pixel 31. The second light emitting layer 56g according to the sixth embodiment is arranged so that a width W21 in the Y-direction thereof is larger than the width in the Y-direction of one sub-pixel 32 and is equal to or smaller than the width W1 of the pixel 31. The first light emitting layer 56b and the second light emitting layer 56g are arranged to extend over adjacent pixels 31.

As illustrated in FIG. 20, in the pixel 31 according to the sixth embodiment, there is an allowance in the width W22 in the Y-direction of the first light emitting layer 56b and the width W21 in the Y-direction of the second light emitting layer 56g even when the width in the Y-direction of the pixel 31 is narrowed. As a result, even when the accuracy of the pixel 31 is increased, the width W22 in the Y-direction of the first light emitting layer 56b and the width W21 in the Y-direction of the second light emitting layer 56g can be secured, and manufacturing yield can be improved. The area for each sub-pixel 32 can be secured even when the accuracy of the image display unit 30 is increased, so that the light emission quantity of the self-luminous body can be prevented from being lowered.

Seventh Embodiment

Figure 21:
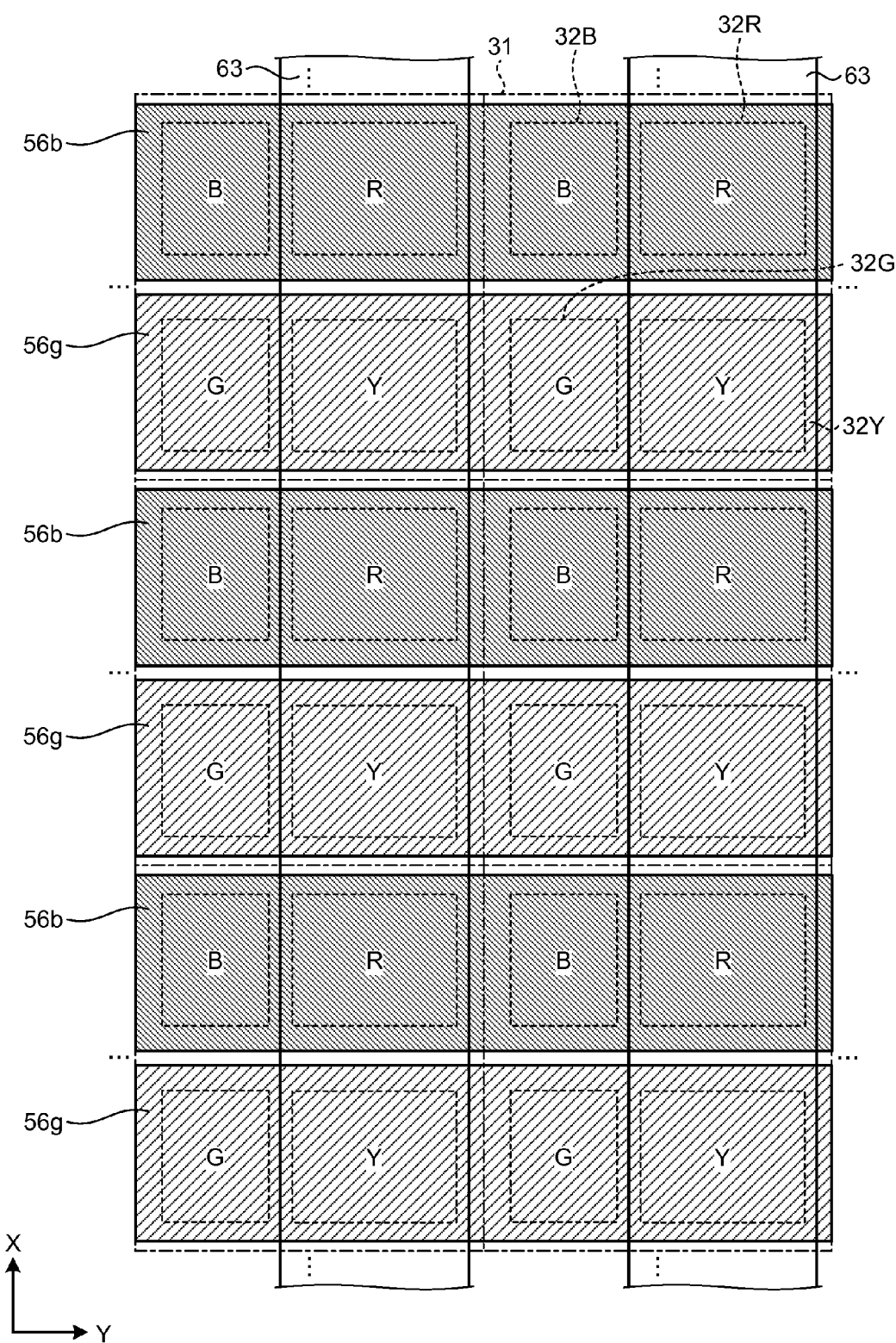
FIG. 21 is a schematic diagram illustrating a planar arrangement of a first light emitting layer and a second light emitting layer according to a seventh embodiment.

FIG. 21 is a schematic diagram illustrating a planar arrangement of the first light emitting layer and the second light emitting layer according to a seventh embodiment. The same components as those described in the embodiments described above are denoted by the same reference numerals, and redundant description will not be repeated.

As illustrated in FIG. 21, the color conversion layer 63 according to the seventh embodiment is formed in a stripe shape extending in the X-direction. In this way, the direction in which the color conversion layer 63 is formed intersects with the direction in which the first light emitting layer 56b and the second light emitting layer 56g are formed. The same color conversion layer 63 covers part of the first light emitting layer 56b and the second light emitting layer 56g. As a result, as compared with a case of forming the color conversion layer 63 for each sub-pixel 32, there is an allowance in alignment accuracy for being overlapped with the first light emitting layer 56b and the second light emitting layer 56g in forming the color conversion layer 63. In the pixel 31 according to the seventh embodiment, even when the width in the X-direction of the pixel 31 is narrowed, there is an allowance in the width in the X-direction of the first light emitting layer 56b and the width in the X-direction of the second light emitting layer 56g. As a result, even when the accuracy of the pixel 31 is increased, the width in the X-direction of the first light emitting layer 56b and the width in the X-direction of the second light emitting layer 56g can be secured, and the area for one sub-pixel 32 can be secured. The area for each sub-pixel 32 can be secured even when the accuracy of the image display unit 30 is increased, so that the light emission quantity of the self-luminous body can be prevented from being lowered.

Eighth Embodiment

Figure 22:
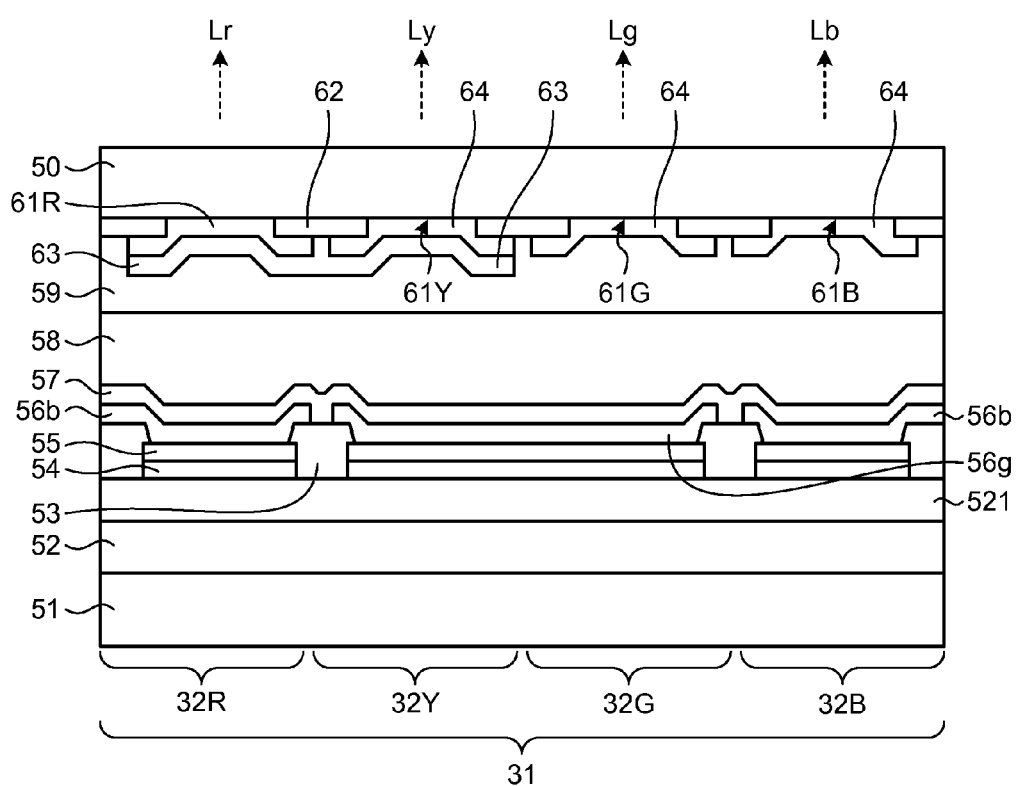
FIG. 22 is a diagram illustrating a cross-sectional structure of an image display unit according to an eighth embodiment.

FIG. 22 is a diagram illustrating a cross-sectional structure of the image display unit according to an eighth embodiment. FIG. 22 illustrates a cross section of FIG. 10 similarly to FIG. 11. The same components as those described in the embodiments described above are denoted by the same reference numerals, and redundant description will not be repeated.

As illustrated in FIG. 22, the image display unit 30 includes the color conversion layer 63 and the color filter 61R for transmitting the first color light Lr among the light emitting components of the first light emitting layer 56b, which are arranged between the first light emitting layer 56b and the image observer. Similarly, the color conversion layer 63 and a scattering layer 64 are arranged at the opening 61Y between the second light emitting layer 56g and the image observer for transmitting second color light Ly among the light emitting components of the second light emitting layer 56g.

The image display unit 30 also includes the scattering layer 64 at the opening 61G through which the light emitting component of the second light emitting layer 56g can be emitted to the image observer. The image display unit 30 also includes the scattering layer 64 at the opening 61B through which the light emitting component of the first light emitting layer 56b can be emitted to the image observer.

When the organic light emitting diode E1 serving as the self-luminous body resonates and emphasizes only light of a wavelength the optical path length of which is the same between the lower electrode 55 and the upper electrode 57, and weakens light of other wavelengths the optical path length of which is not the same, the light emitting component of the first light emitting layer 56b and the light emitting component of the second light emitting layer 56g may have a narrow wave form of a half-value width. Even in this case, the scattering layer 64 can prevent the colors of adjacent sub-pixels 32 from being mixed by causing the light passing therethrough to be scattered light to adjust a viewing angle. In this way, more preferably, at least the sub-pixel 32 not covered with the color conversion layer 63 includes the scattering layer 64 for causing the light from the first light emitting layer 56b or the second light emitting layer 56g to be the scattered light. Examples of a material of the scattering layer 64 include a spherical particle that is an acrylic or silicon-based polymer particle. Examples of the material of the scattering layer 64 include a spherical particle that may be a titanium oxide (white diffusion) particle. The material of the scattering layer 64 is preferably a material that transmits and diffuses (scatters forward) incident light.

Ninth Embodiment

Figure 23:
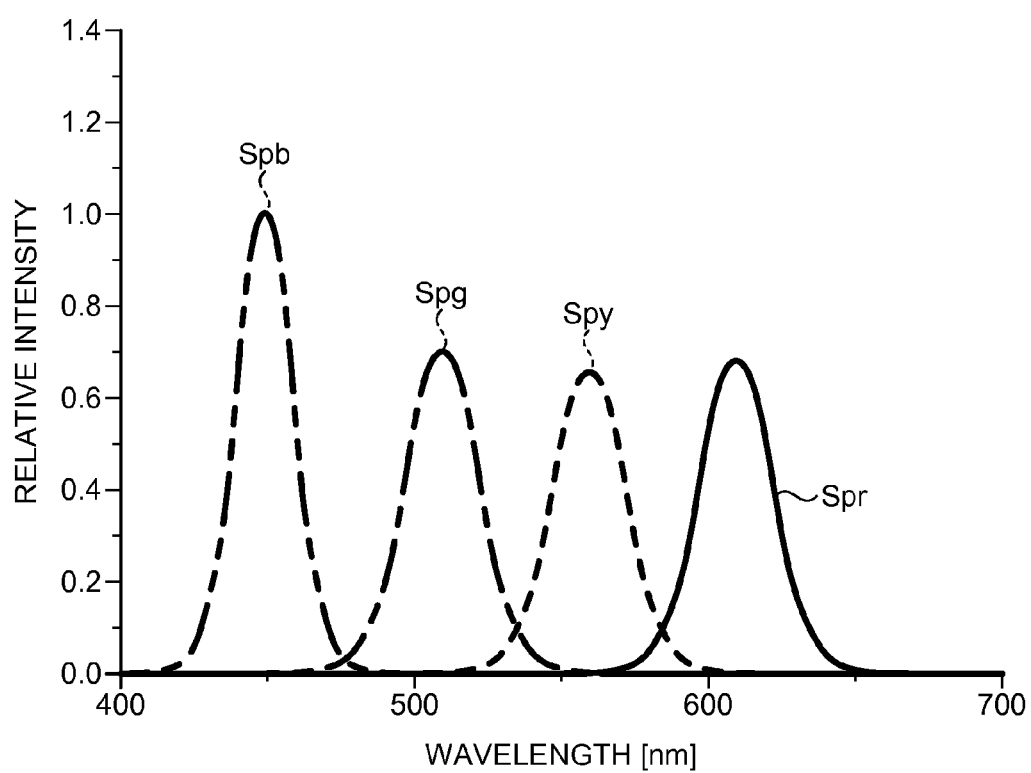
FIG. 23 is a diagram illustrating a relation between a relative intensity distribution and an emission wavelength of a color conversion layer according to a ninth embodiment.

FIG. 23 is a diagram illustrating a relation between the relative intensity distribution and the emission wavelength of the color conversion layer according to a ninth embodiment. The same components as those described in the embodiments described above are denoted by the same reference numerals, and redundant description will not be repeated.

The color conversion layer 63 according to the ninth embodiment is a quantum dot that can absorb light of one or more wavelength bands in the first light emitting layer and the second light emitting layer, and emit light having a longer wavelength than that of the absorbed light. The quantum dot is a nano-sized semiconductor particle. For example, a main component of a core of the quantum dot is CdSe, and the core is covered with ZnS (covering layer). By changing the metal compound or a diameter of the metal compound, the color conversion layer 63 according to the ninth embodiment can change a wavelength band selected from among excitation wavelength bands Spb, Spg, Spy, and Spr illustrated in FIG. 23, the wavelength band absorbing light of one or more wavelength bands in the first light emitting layer and the second light emitting layer and emitting fluorescence. The color conversion layer 63 according to the ninth embodiment can narrow the half-value width of the emission wavelength.

Application Example

Figure 24:
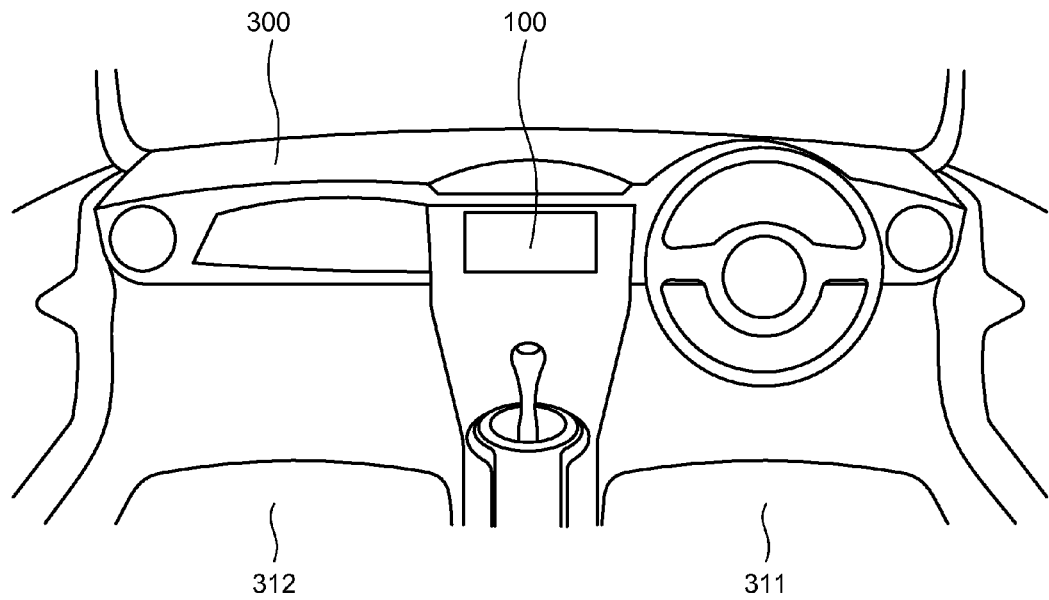
FIG. 24 is a diagram illustrating an example of an electronic apparatus to which the display device according to an embodiment is applied.
Figure 25:
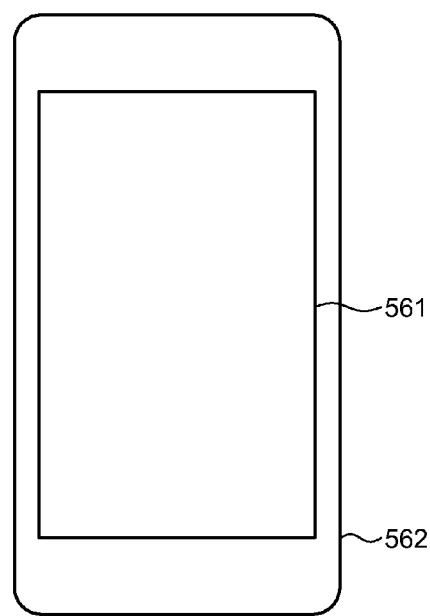
FIG. 25 is a diagram illustrating an example of an electronic apparatus to which the display device according to an embodiment is applied.

The following describes an application example of the display device 100 described in the embodiments and the modification with reference to FIG. 24 and FIG. 25. FIG. 24 and FIG. 25 are diagrams each illustrating an example of an electronic apparatus to which the display device according to the embodiments is applied. The display device 100 according to the embodiments can be applied to electronic apparatuses in various fields such as a car navigation system illustrated in FIG. 24, a television apparatus, a digital camera, a notebook-type personal computer, a portable electronic apparatus such as a mobile phone illustrated in FIG. 25, or a video camera. In other words, the display device 100 according to the embodiments can be applied to electronic apparatuses in various fields that display an image signal input from the outside or an image signal generated inside as an image or video. The electronic apparatus includes the control device 11 (refer to FIG. 1) that supplies an input image signal to the display device 100 and controls the operation of the display device 100.

The electronic apparatus illustrated in FIG. 24 is a car navigation device to which the display device 100 according to the embodiments and the modification is applied. The display device 100 is mounted on a dashboard 300 inside an automobile. More specifically, the display device 100 is mounted on the dashboard 300 between a driver's seat 311 and a passenger seat 312. The display device 100 of the car navigation device is used for displaying navigation, displaying a music operation screen, reproducing and displaying a movie, or the like.

The electronic apparatus illustrated in FIG. 25 is a portable information terminal that operates as a mobile computer, a multifunctional mobile phone, a mobile computer capable of making a voice call, or a mobile computer capable of performing communications, to which the display device 100 according to the embodiments and the modification is applied. The electronic apparatus may be called a smartphone or a tablet terminal. The portable information terminal includes a display unit 561 on a surface of a housing 562, for example. The display unit 561 includes the display device 100 according to the embodiments and the modification and a touch detection (i.e., a touch panel) function that can detect an external proximity object.

The embodiments are not limited to the above description. The components according to the embodiments described above include a component that is easily conceivable by those skilled in the art, a component that is substantially identical thereto, and a component within a range of equivalents. The components can be variously omitted, replaced, and modified without departing from the gist of the embodiments described above. For example, in the image display unit 30 illustrated in FIG. 1, the direction along the column may extend in the Y-direction (second direction), and the direction along the row may extend in the X-direction (first direction).

What is claimed is:

1. A display device comprising:
   a substrate;
   a first light emitting layer extending in a first direction along a column or a row of a plurality of sub-pixels arranged in a matrix on the substrate;
   a second light emitting layer that extends in the first direction, is arranged alternately with the first light emitting layer in a second direction, and emits light of a wavelength different from that of the first light emitting layer; and
   a color conversion layer that extends in the second direction, is arranged at a position for covering part of the first light emitting layer and the second light emitting layer, absorbs light emitted from the first light emitting layer, and converts the absorbed light so that a wavelength of the absorbed light becomes longer.

2. The display device according to claim 1, wherein the color conversion layer is arranged in a form of a plurality of stripes, and adjacent color conversion layers are arranged to have a gap therebetween in the first direction.

3. The display device according to claim 1, wherein one pixel is formed of two rows and two columns of the sub-pixels, and a shape of the entire pixel is a rectangle.

4. The display device according to claim 2, wherein sub-pixels covered with the color conversion layer and sub-pixels not covered with the color conversion layer are arranged side by side along the first direction.

5. The display device according to claim 4, wherein an area of the sub-pixel covered with the color conversion layer is larger than the area of the sub-pixel not covered with the color conversion layer.

6. The display device according to claim 1, wherein the color conversion layer is covered with a filter layer that limits a wavelength to be transmitted to an emitting side.

7. The display device according to claim 4, wherein at least one of the sub-pixel not covered with the color conversion layer includes a scattering layer for causing light from the first light emitting layer or the second light emitting layer to be scattered light.

* * * * *